United States Patent
Maruo et al.

(10) Patent No.: US 11,921,140 B2
(45) Date of Patent: Mar. 5, 2024

(54) TEST APPARATUS AND TEST METHOD

(71) Applicant: ANRITSU CORPORATION, Kanagawa (JP)

(72) Inventors: Tomohiko Maruo, Kanagawa (JP); Hiroshi Hasegawa, Kanagawa (JP)

(73) Assignee: ANRITSU CORPORATION, Kanagawa (JP)

(*) Notice: Subject to any disclaimer, the term of this patent is extended or adjusted under 35 U.S.C. 154(b) by 113 days.

(21) Appl. No.: 17/663,449

(22) Filed: May 16, 2022

(65) Prior Publication Data
US 2023/0033833 A1    Feb. 2, 2023

(30) Foreign Application Priority Data

Aug. 2, 2021   (JP) .................. 2021-126627

(51) Int. Cl.
*G01R 29/10*    (2006.01)
*G01R 29/08*    (2006.01)

(52) U.S. Cl.
CPC ..... *G01R 29/0821* (2013.01); *G01R 29/0878* (2013.01); *G01R 29/0892* (2013.01); *G01R 29/105* (2013.01)

(58) Field of Classification Search
CPC .. H04B 17/10; H04B 17/11–15; G01R 29/08; G01R 29/0821; G01R 29/0878; G01R 29/10; G01R 29/105
See application file for complete search history.

(56) References Cited

U.S. PATENT DOCUMENTS

| 10,969,427 | B2* | 4/2021 | Rowell | G01R 31/3025 |
| 2020/0177289 | A1 | 6/2020 | Maruo et al. | |
| 2021/0341572 | A1* | 11/2021 | Hamberger | G01S 7/4052 |

FOREIGN PATENT DOCUMENTS

JP    2020-085784 A    6/2020

OTHER PUBLICATIONS

3GPP TR 38.810 V16.2.0 (Mar. 2019), Technical Report, 3rd Generation Partnership Project; Technical Specification Group Radio Access Network; NR; Study on test methods, (Release 16).

* cited by examiner

*Primary Examiner* — Hasan Islam
(74) *Attorney, Agent, or Firm* — Pearne & Gordon LLP

(57) ABSTRACT

There is provided a test apparatus that measures transmission characteristics or reception characteristics of a DUT having an antenna under test, and includes an anechoic box, a posture changeable mechanism 56, a first test antenna 6a and a second test antenna 6b, for measuring the transmission characteristics or the reception characteristics of the DUT, a reflector that reflects a radio signal radiated by the first test antenna and converts the radio signal into a plane wave radio signal, and a movable antenna mechanism 60 that moves a position of the second test antenna such that the radio signal is transmitted to or received from the DUT installed in a far field at a plurality of angles of arrival, with reference to a radio-wave arrival direction from the first test antenna.

12 Claims, 16 Drawing Sheets

TEST APPARATUS AND TEST METHOD

TECHNICAL FIELD

The present invention relates to a test apparatus and a test method for measuring transmission characteristics or reception characteristics of a device under test by using an anechoic box in an OTA (Over The Air) environment.

BACKGROUND ART

In recent years, with the development of multimedia, radio terminals (smartphones and the like) equipped with antennae for radio communication such as cellular and wireless LAN have been actively produced. In the future, in particular, there is a demand for radio terminals that transmit and receive radio signals compatible with IEEE 802.11ad, 5G cellular, and the like, which use wideband signals in the millimeter wave band.

In a design and development company or manufacturing plant of a radio terminal, a performance test as follows is performed on a radio communication antenna of the radio terminal: an output level of a transmission radio wave defined for each communication standard or reception sensitivity is measured, and it is determined whether or not radio frequency (RF) characteristics thereof satisfy predetermined criteria. In the performance test, radio resource management (RRM) characteristics are also measured. The RRM characteristics are measured in order to check whether or not the radio resource control between a base station and a radio terminal, for example, the handover between the adjacent base stations operates correctly.

With the transition of generations from 4G or 4G advanced to 5G, a test method of the above-described performance test also changes. For example, in a performance test in which a radio terminal for a 5G New Radio (NR) system is set as a device under test (DUT), it is not possible to use a method of connecting an antenna terminal of the DUT and a test apparatus in a wired manner, which is the mainstream in tests for 4G, 4G advanced, or the like. The reason is that characteristics are deteriorated by attaching the antenna terminal to a high frequency circuit, or it is not realistic to attach the antenna terminal to all elements in consideration of a space and cost because the number of elements in an array antenna is large. Therefore, a so-called OTA test is performed (for example, see Patent Document 1). In the OTA test, a DUT with a test antenna is accommodated in an anechoic box that is not influenced by the surrounding radio wave environment, transmission of a test signal from the test antenna to the DUT and reception of a measurement target signal from the DUT that receives the test signal by the test antenna are performed by radio communication.

In the OTA test, for example, a spherical quiet zone is formed by the test antenna disposed in the anechoic box, and the DUT is disposed in the quiet zone. Here, the quiet zone has a concept representing a range of a spatial region in which the DUT is irradiated with a radio wave emitted from the test antenna with a substantially uniform amplitude and phase in the anechoic box forming the OTA test environment (for example, see Non Patent Document 1). It is possible to perform the OTA test in a state where an influence of scattered waves from the surroundings is suppressed, by disposing the DUT in such a quiet zone.

RELATED ART DOCUMENT

Patent Document

[Patent Document 1] JP-A-2020-085784

Non Patent Document

[Non Patent Document 1] 3GPPTR 38.810

DISCLOSURE OF THE INVENTION

Problem that the Invention is to Solve

FIG. 16 is a plan view of a test apparatus that measures RRM characteristics of a DUT in the related art when seen from above with a top plate of an anechoic box of the test apparatus being removed. The test apparatus in the related art includes a reflector reflection type test antenna 206a that transmits and receives radio waves to and from a DUT 100 via a reflector 207, and test antennae 206b, 206c, 206d, 206e, and 206f that transmit and receive radio waves to and from the DUT 100. The five test antennae 206b, ..., and 206f are arranged to form five different angles of arrival (30°, 60°, 90°, 120°, and 150°) based on an arrangement position (origin O) of the DUT 100, with reference to a radio-wave arrival direction from the reflector reflection type test antenna 206a. In a test, two test antennae selected from the test antennae 206a, ..., and 206f are used to measure transmission and reception characteristics such as RRM characteristics with respect to a plurality of different angles of arrival. Meanwhile, if the number of test antennae is large, an apparatus cost and an installation cost are high, it is desired to reduce the number of test antennae.

The present invention has been made to solve such a problem in the related art, and an object of the present invention is to provide a test apparatus and a test method capable of executing far field measurement of transmission and reception characteristics of a device under test, such as RRM characteristics, with a small number of antennae.

Means for Solving the Problem

In order to solve the above problems, according to the present invention, there is provided a test apparatus (1) that measures transmission characteristics or reception characteristics of a device under test (100) including an antenna under test (110), the apparatus including: an anechoic box (50) that has an internal space that is not influenced by a surrounding radio wave environment; a posture changeable mechanism (56) that sequentially changes a posture of the device under test disposed in a quiet zone (QZ) in the internal space; a first test antenna (6a) and a second test antenna (6b) that are accommodated in the internal space and transmit or receive radio signals to or from the antenna under test, for measuring the transmission characteristics or the reception characteristics of the device under test; a reflector (7) that reflects a radio signal radiated by the first test antenna and converts the radio signal into a plane wave radio signal; and a movable antenna mechanism (60) that moves a position of the second test antenna such that the radio signal is transmitted to or received from the device under test installed in a far field at a plurality of angles of arrival or a plurality of angles of departure, with reference to a radio-wave arrival direction from the first test antenna or a radio wave emission direction to the first test antenna.

As described above, the test apparatus according to the present embodiment includes the movable antenna mechanism that moves the position of the second test antenna such that the radio signal is transmitted to or received from the device under test installed in the far field at the plurality of angles of arrival, with reference to the radio-wave arrival direction from the first test antenna. With this configuration, in far field measurement of transmission and reception characteristics such as RRM characteristics of the device under test, it is not necessary to provide a test antenna according to the number of angles of arrival to be tested, and it is possible to reduce the number of antennae. Therefore, it is possible to reduce a cost of devices such as antennae and a cost of attachment work.

Further, in the test apparatus according to the present invention, the movable antenna mechanism may include an antenna holding unit (600) that holds the second test antenna, and a moving mechanism (700) that moves the antenna holding unit on a circle.

With this configuration, in the test apparatus according to the present invention, it is possible to reduce the number of antennae, and it is possible to consistently keep a distance between the second test antenna and the device under test even when the angles of arrival are different from each other.

Further, in the test apparatus according to the present invention, the antenna holding unit may have a columnar fulcrum (61) that holds the second test antenna, and the fulcrum may be tilted from a vertical direction such that one end portion of the fulcrum attached to the moving mechanism is closer to a center axis of the circle than the other end portion of the fulcrum.

With this configuration, in the test apparatus according to the present invention, it is possible to reduce an occupied (installation) area and an occupied space (volume) of the movable antenna mechanism, and it is possible to efficiently use the limited internal space of the anechoic box.

Further, the test apparatus according to the present invention may further include a mirror (9) that reflects a radio signal radiated from the second test antenna and transmits the radio signal to the antenna under test, and reflects a radio signal radiated from the antenna under test and transmits the radio signal to the second test antenna, in which the antenna holding unit may hold the second test antenna and the mirror at an interval in a longitudinal direction.

With this configuration, the test apparatus according to the present invention can change a path of the radio signal transmitted and received between the second test antenna and the antenna under test by the mirror, so that it is possible to secure a distance between the antennae required for far field measurement even in the limited internal space of the anechoic box.

Further, in the test apparatus according to the present invention, the moving mechanism may include a linear motion unit (701) that linearly moves a moving stand (72), an arcuate rail (76), a movable stand (77) to which the antenna holding unit is fixed and which is movable along the rail, and a link (703) that connects the moving stand and the movable stand and moves the movable stand along the rail by linear movement of the moving stand, and the link may be connected to the moving stand such that a longitudinal direction of the link is consistently orthogonal to a moving direction of the moving stand.

With this configuration, the test apparatus according to the present invention does not need to provide test antennae for the number of angles of arrival for testing, and the number of antennae can be reduced and the second test antenna can be installed to any angle of arrival within a predetermined range. Further, the movable antenna mechanism can be installed in the periphery while avoiding the center posture changeable mechanism in which the device under test is held in the anechoic box, and it is possible to efficiently use the limited internal space of the anechoic box.

Further, in the test apparatus according to the present invention, the moving mechanism may include a linear motion unit (701) that linearly moves a moving stand (72), an arcuate rail (76), a movable stand (77) to which the antenna holding unit is fixed and which is movable along the rail, and a link (703) that connects the moving stand and the movable stand and moves the movable stand along the rail by linear movement of the moving stand, and the link may be connected to the moving stand such that an angle formed by a longitudinal direction of the link with respect to a moving direction of the moving stand is changed according to a position of the moving stand.

With this configuration, the test apparatus according to the present invention can shorten a length of the linear motion unit in the longitudinal direction. Therefore, it is possible to efficiently use the limited internal space of the anechoic box while avoiding the center posture changeable mechanism in which the device under test is held in the anechoic box.

Further, in the test apparatus according to the present invention, the moving mechanism may include a ring-shaped or arcuate rack (81) having a plurality of teeth formed on an inner peripheral surface or an outer peripheral surface, a pinion (82) having a gear that engages with the teeth of the rack, and moving along the rack by being rotated by a rotation drive unit, and a movable stand (84) attached to the pinion, and the antenna holding unit may be attached to the movable stand.

With this configuration, in the test apparatus according to the present invention, the movable antenna mechanism can be installed in the periphery while avoiding the center posture changeable mechanism in which the device under test is held in the anechoic box, and it is possible to efficiently use the limited internal space of the anechoic box.

Further, in the test apparatus according to the present invention, the moving mechanism may include a ring-shaped or arcuate rack (85) having a plurality of teeth formed on an inner peripheral surface or an outer peripheral surface, a pinion (86) having a gear that engages with the teeth of the rack, and rotationally moving the rack by being rotated by a rotation drive unit, and a movable stand (88) attached to the rack, and the antenna holding unit may be attached to the movable stand.

With this configuration, in the test apparatus according to the present invention, the movable antenna mechanism can be installed in the periphery while avoiding the center posture changeable mechanism in which the device under test is held in the anechoic box, and it is possible to efficiently use the limited internal space of the anechoic box.

Further, the test apparatus according to the present invention may further include a mirror (9) that reflects a radio signal radiated from the second test antenna and transmits the radio signal to the antenna under test, and reflects a radio signal radiated from the antenna under test and transmits the radio signal to the second test antenna, in which the antenna holding unit may hold the second test antenna and the mirror at an interval in a longitudinal direction.

In addition, according to the present invention, there is provided a test method using a test apparatus (1) that measures transmission characteristics or reception characteristics of a device under test (100) including an antenna under test (110), the test apparatus including an anechoic box (50) that has an internal space that is not influenced by a surrounding radio wave environment, a posture changeable mechanism (56) that sequentially changes a posture of the device under test disposed in a quiet zone (QZ) in the internal space, a first test antenna (6a) and a second test antenna (6b) that are accommodated in the internal space and transmit or receive radio signals to or from the antenna under test, for measuring the transmission characteristics or the reception characteristics of the device under test, a reflector (7) that reflects a radio signal radiated by the first test antenna and converts the radio signal into a plane wave radio signal; and a movable antenna mechanism (60) that moves a position of the second test antenna such that the radio signal is transmitted to or received from the device under test installed in a far field at a plurality of angles of arrival or a plurality of angles of departure, with reference to a radio-wave arrival direction from the first test antenna or a radio wave emission direction to the first test antenna, the method including: a step of selecting one angle of arrival among a plurality of angles of arrival or one angle of departure among a plurality of angles of departure; a step of moving the second test antenna by the movable antenna mechanism to have the selected angle of arrival or angle of departure; a step of sequentially changing the posture of the device under test disposed in the quiet zone; and a step of measuring the transmission characteristics or the reception characteristics of the device under test by using the first and second test antennae, each time the posture of the device under test is changed.

As described above, the test apparatus used in the test method according to the present invention includes the movable antenna mechanism that moves the position of the second test antenna such that the radio signal is transmitted to or received from the device under test installed in the far field at the plurality of angles of arrival, with reference to the radio-wave arrival direction from the first test antenna. The present test method includes the step of moving the second test antenna by the movable antenna mechanism to have the selected angle of arrival. Therefore, it is possible to execute far field measurement for transmission and reception characteristics such as RRM characteristics of the device under test with a small number of antennae. By reducing the number of antennae, it is possible to reduce the cost of devices such as antennae and the cost of attachment work.

[Advantage of the Invention]

According to the present invention, it is possible to provide a test apparatus and a test method capable of executing far field measurement of the transmission and reception characteristics of the device under test, such as and the RRM characteristics, with a small number of antennae.

BEST MODE FOR CARRYING OUT THE INVENTION

Figure 1:
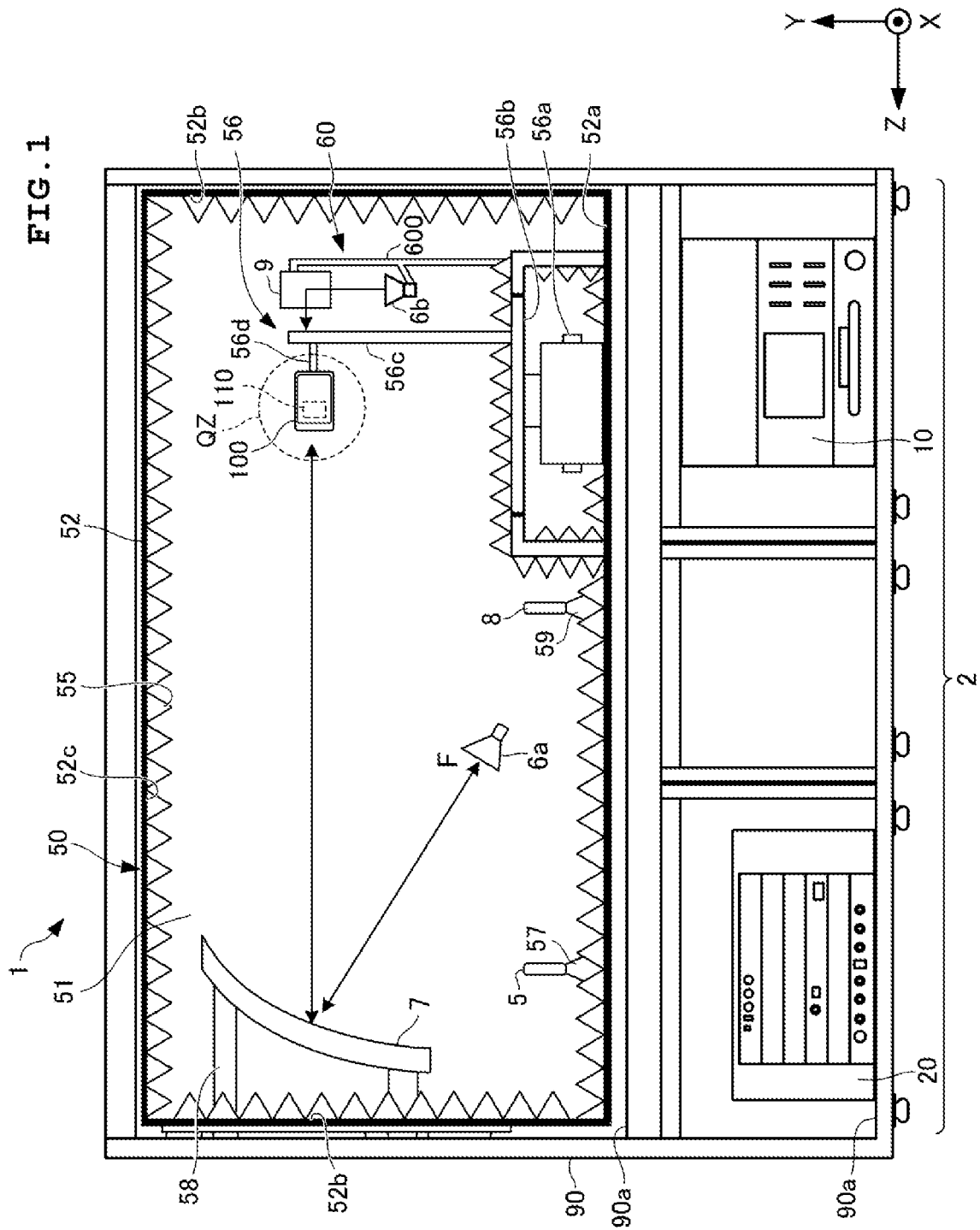
FIG. 1 is a diagram illustrating a schematic configuration of an entire test apparatus according to a first embodiment of the present invention.

Hereinafter, a test apparatus and a test method according to embodiments of the present invention will be described with reference to the drawings. The dimensional ratio of each component in each drawing is not necessarily equal to the actual dimensional ratio.

First Embodiment

A test apparatus 1 according to a first embodiment measures transmission characteristics or reception characteristics of a DUT 100 including an antenna 110, for example, measures RF characteristics and RRM characteristics of the DUT 100. For this purpose, the test apparatus 1 includes an anechoic box (also referred to as an OTA chamber) 50, two test antennae 6a and 6b (hereinafter, also collectively referred to as a test antenna 6), a posture changeable mechanism 56, an integrated control device 10, an NR system simulator 20, and a signal processing unit 40. The integrated control device 10, the NR system simulator 20, and the signal processing unit 40 constitute a measurement device 2.

Figure 2:
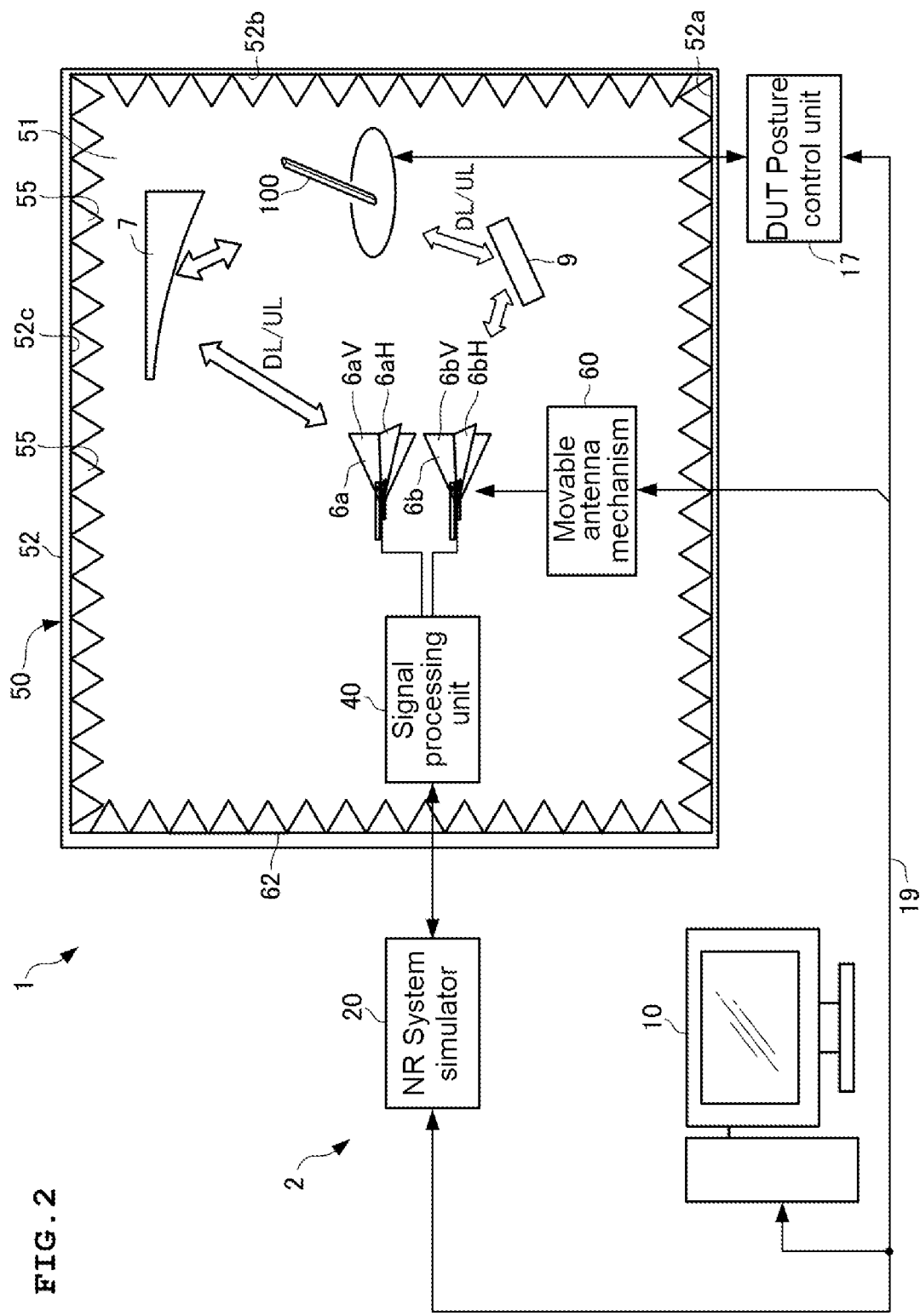
FIG. 2 is a block diagram illustrating a functional configuration of the test apparatus according to the first embodiment of the present invention.

FIG. 1 illustrates an external structure of the test apparatus 1. FIG. 2 illustrates a functional block of the test apparatus 1. FIG. 1 illustrates an arrangement form of each component in a state where the anechoic box 50 is seen through from the front.

As illustrated in FIGS. 1 and 2, the anechoic box 50 has an internal space 51 that is not influenced by the surrounding radio wave environment. The test antenna 6 is installed in the internal space 51 of the anechoic box 50, and transmits or receives a radio signal for measuring the transmission characteristics or the reception characteristics of the DUT 100, to and from the antenna 110. The posture changeable mechanism 56 changes the posture of the DUT 100 disposed in a quiet zone QZ in the internal space 51 of the anechoic box 50. The integrated control device 10, the NR system simulator 20, and the signal processing unit 40 measure the transmission characteristics or the reception characteristics of the DUT 100 having a posture that is changed by the posture changeable mechanism 56, by using one or two test antennae 6 for the DUT 100.

The test apparatus 1 is used, for example, together with a rack structure body 90 including a plurality of rack storage units 90a as illustrated in FIG. 1, and is operated in a state where each component is mounted on each rack storage unit 90a. FIG. 1 illustrates an example in which the integrated control device 10, the NR system simulator 20, and the anechoic box 50 are mounted on each of three rack storage units 90a of the rack structure body 90. Hereinafter, each component will be described.

Anechoic Box

The anechoic box 50 is used for measuring transmission or reception characteristics of a radio terminal, and realizes an OTA test environment for performing a performance test on the radio terminal for, for example, 5G. As illustrated in FIGS. 1 and 2, the anechoic box 50 is configured with, for example, a metal housing body 52 having a rectangular parallelepiped internal space 51. The anechoic box 50 accommodates the DUT 100 and the two test antennae 6 directly or indirectly facing the antenna 110 of the DUT 100 in the internal space 51 in a state of preventing the intrusion of a radio wave from the outside and the radiation of radio waves to the outside.

A radio wave absorber 55 is attached to the entirety of the inner surface of the anechoic box 50, that is, the entire surface of a bottom surface 52a, a side surface 52b, and a top surface 52c of the housing body 52 to secure anechoic characteristics of the internal space 51. Thus, a radiation regulation function of a radio wave to the outside is reinforced. In this manner, the anechoic box 50 forms the internal space 51 that is not affected by the surrounding radio wave environment. The anechoic box 50 used in the present embodiment is, for example, a compact antenna test range (CATR) type anechoic chamber.

DUT

The DUT 100 as a device under test is, for example, a radio terminal such as a smartphone. Communication standards for the DUT 100 include cellular (LTE, LTE-A, W-CDMA (registered trademark), GSM (registered trademark), CDMA 2000, 1×EV-DO, TD-SCDMA, and the like), wireless LAN (IEEE 802.11b/g/a/n/ac/ad, and the like), Bluetooth (registered trademark), GNSS (GPS, Galileo, GLONASS, BeiDou, and the like), FM, and digital broadcasting (DVB-H, ISDB-T, and the like). The DUT 100 may be a radio terminal that transmits and receives a radio signal of a millimeter wave band corresponding to 5G cellular or the like.

In the present embodiment, the DUT 100 is a 5G NR radio terminal, for example. For the 5G NR radio terminal, it is defined by the 5G NR standard, that a predetermined frequency band including a millimeter wave band and other frequency bands used in LTE and the like is set as a communicable frequency range. Thus, the antenna 110 of the DUT 100 transmits or receives a radio signal of a predetermined frequency band (5G NR band), which is a measurement target for the transmission characteristics or the reception characteristics of the DUT 100. The antenna 110 is, for example, an array antenna such as a Massive-MIMO antenna, and corresponds to an antenna under test in the present invention.

In the present embodiment, the DUT 100 can transmit and receive a test signal and a measurement target signal via the test antenna 6 and, if necessary, a reflector 7 or a mirror 9 during measurement related to transmission and reception characteristics in the anechoic box 50.

Posture Changeable Mechanism

Next, the posture changeable mechanism 56 provided in the internal space 51 of the anechoic box 50 will be described. As illustrated in FIG. 1, the posture changeable mechanism 56 is provided on the bottom surface 52a of the housing body 52 of the anechoic box 50 on the internal space side. The posture changeable mechanism 56 changes a posture of the DUT 100 disposed in the quiet zone QZ. The posture changeable mechanism 56 is, for example, a biaxial positioner including a rotating mechanism that rotates around each of two axes. The posture changeable mechanism 56 forms an OTA test system (Combined-axes system) in which the DUT 100 is rotated with a degree of freedom of rotation around two axes in a state where the test antenna 6 is set. Specifically, the posture changeable mechanism 56 includes a drive unit 56a, a turntable 56b, a fulcrum 56c, and a DUT mounting portion 56d as a device-under-test mounting portion.

The drive unit 56a is configured by a drive motor such as a stepping motor that generates a rotational driving force. The drive unit is installed on, for example, the bottom surface 52a. The turntable 56b rotates by a predetermined angle around one of the two axes orthogonal to each other by the rotational driving force of the drive unit 56a. The fulcrum 56c is connected to the turntable 56b. The fulcrum extends from the turntable 56b in a direction of one axis, and rotates together with the turntable 56b by the rotational driving force of the drive unit 56a. The DUT mounting portion 56d extends from the side surface of the fulcrum 56c in a direction of the other axis of the two axes, and rotates by a predetermined angle around the other axis by the rotational driving force of the drive unit 56a. The DUT 100 is mounted on the DUT mounting portion 56d.

The above-described one axis is, for example, an axis (Y axis in FIG. 1) extending in a vertical direction to the bottom surface 52a the drawing). The other axis is, for example, an axis extending in a horizontal direction from the side surface of the fulcrum 56c. The posture changeable mechanism 56 configured as described above can rotate the DUT 100 held on the DUT mounting portion 56d, so as to enable the sequential change of the posture of the DUT in a state where the antenna 110 is directed toward the test antenna 6 and the reflector 7 in all three-dimensional directions. For example, the center of the DUT 100 is set as the rotation center.

In the OTA test system, the center of the DUT 100 or the center of the antenna 110 is disposed at the rotation center (also referred to as the origin O), which is an intersection between the two rotation axes of the posture changeable mechanism 56. A position at which the DUT 100 is disposed refers to the origin O of the OTA test system, and to the center position of the DUT 100 or the center position of the antenna 110, which is disposed in the anechoic box 50. That is, the origin O corresponds to the immovable rotation center when the DUT 100 is rotated around two axes by the posture changeable mechanism 56.

Link Antenna

In the anechoic box 50, two types of link antennae 5 and 8 are attached to the required positions of the housing body 52 by using holders 57 and 59, respectively. The link antennae are provided in order to establish or maintain a link (call) with the DUT 100. The link antenna 5 is a link antenna for LTE, and is used in a non-standalone mode. The link antenna 8 is a link antenna for 5G and is used to maintain a 5G call. The link antennae 5 and 8 are held by the holders 57 and 59, respectively, so as to have directivity with respect to the DUT 100 held by the posture changeable mechanism 56. Since it is possible to use the test antenna 6 as the link antenna instead of using the above link antennae 5 and 8, description will be made below on the assumption that the test antenna 6 also has a function of the link antenna.

Near Field and Far Field

Next, the near field and the far field will be described. A case where radio waves are directly transmitted from an antenna to the DUT 100 is called a direct far field (DFF) method, and a case where radio waves are reflected from the antenna and transmitted to the DUT 100 by reflecting the reflector 7 having a rotating paraboloid is called an indirect far field (IFF) method.

A radio wave having a radiation source being an antenna has a property of propagating while a surface (wave surface) joining points having the same phase spreads spherically around the radiation source. The wave surface is a curved spherical surface (spherical wave) at a distance close to the radiation source, but the wave surface becomes close to a plane (plane wave) at a distance far from the radiation source. In general, a region where the wave surface is required to be considered as a spherical surface is referred to as a near field, and a region where the wave surface may not be considered as a plane is referred to as a far field. The DUT 100 preferably receives a plane wave rather than a spherical wave in order to perform accurate measurement.

In order to receive a plane wave, the DUT 100 needs to be installed in a far field. When the position and antenna size of the antenna 110 in the DUT 100 are not known, the far field is a region beyond $2D^2/\lambda$ from the antenna. Here, D indicates the maximum linear size of the DUT 100, and $\lambda$ indicates a wavelength of the radio wave. When the position of the antenna 110 and the antenna size in the DUT 100 are known, D is the antenna size.

In the present embodiment, the CATR method is used, which is a method of reflecting a radio wave of the test antenna 6a on the rotating paraboloid of the reflector 7, and causing the reflected wave to reach the position of the DUT 100. According to this method, a distance between the test antenna 6a and the DUT 100 can be shortened, and a plane wave region expands from a distance immediately after the reflection on the reflector surface of the reflector 7, so that a propagation loss can be reduced. The degree of the plane wave can be expressed by the phase difference between waves of the same phase. The phase difference that is permissible as the degree of the plane wave is, for example, $\lambda/16$. The phase difference can be evaluated, for example, with a vector network analyzer (VNA).

Test Antenna

Figure 5:
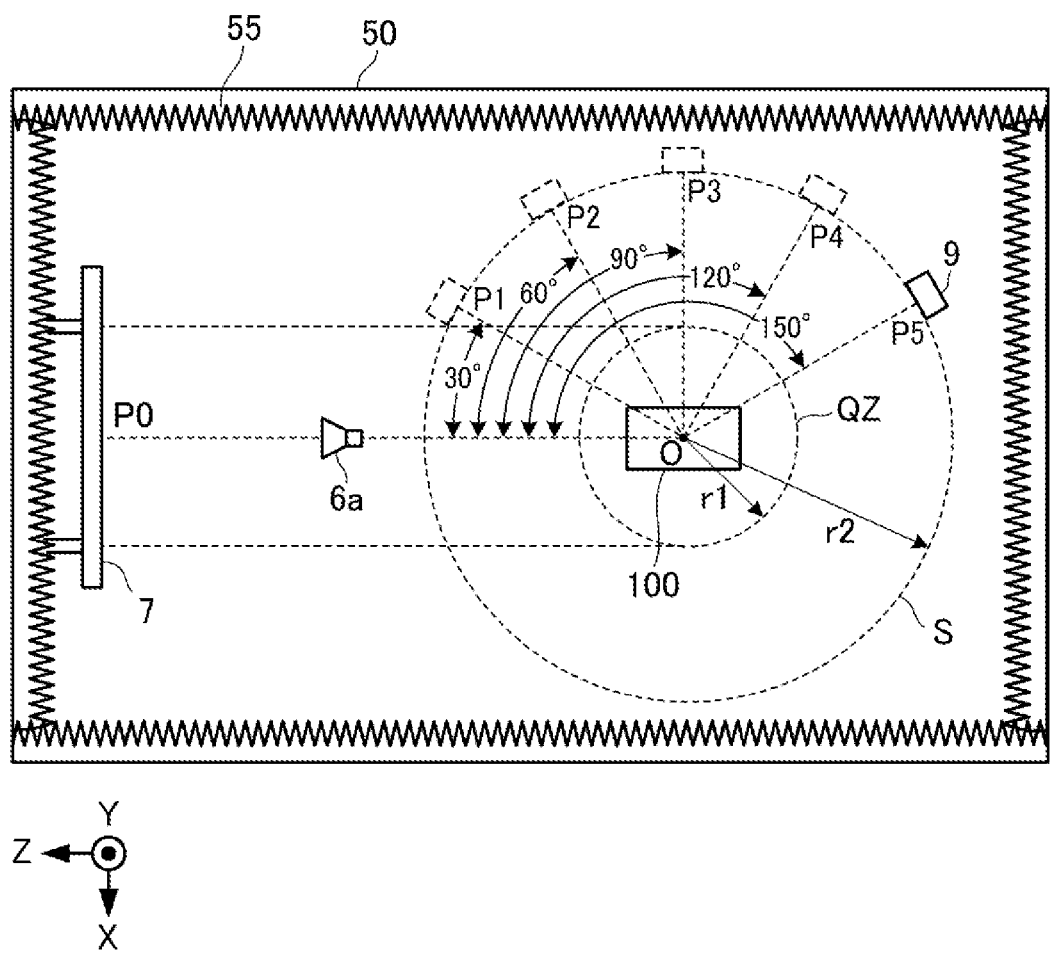
FIG. 5 is a plan view of the test apparatus according to the first embodiment of the present invention when seen from above with a top plate of an anechoic box of the test apparatus being removed.
Figure 6:
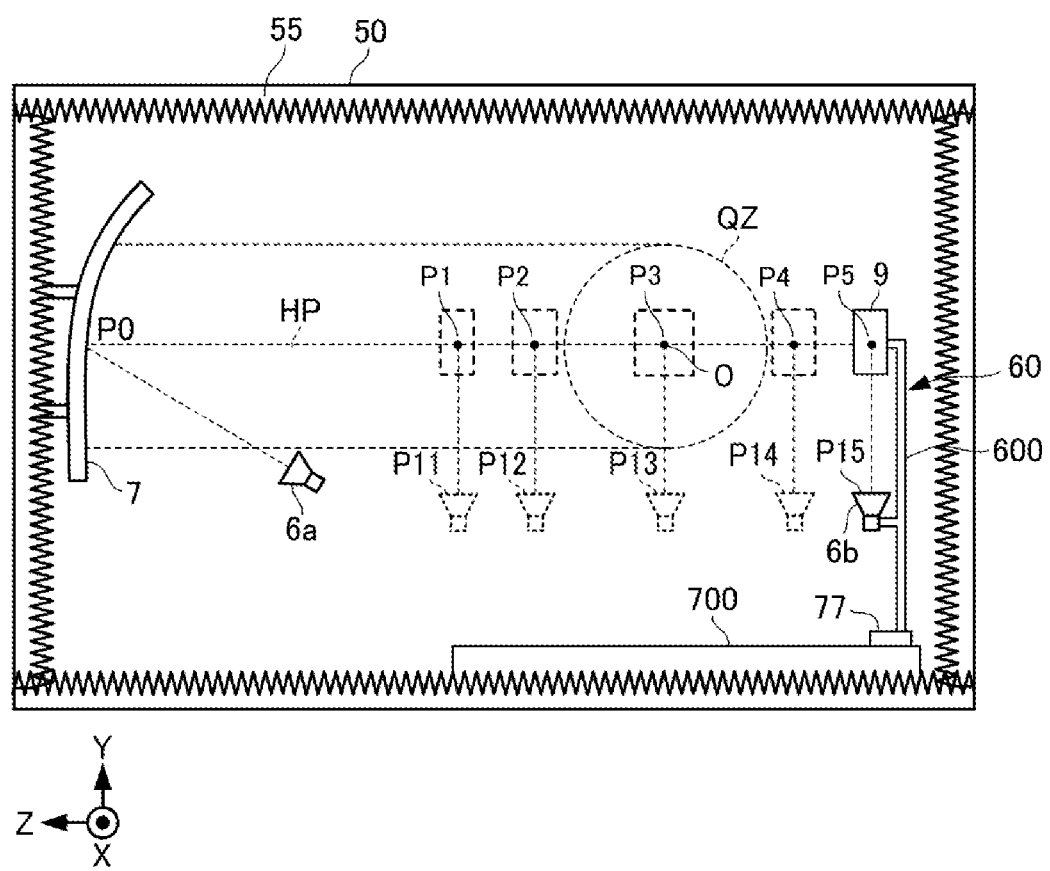
FIG. 6 is a front view of the anechoic box when seen from a front side with a side plate of the anechoic box on a front side being removed.

Next, the test antenna 6 will be described. FIG. 5 is a plan view when the anechoic box 50 of the test apparatus 1 according to the present embodiment is seen from above with a top plate of the anechoic box 50 being removed. FIG. 6 is a front view when the anechoic box 50 is seen from the front side with a side plate (side plate on the lower side in FIG. 6) of the anechoic box 50 on the front side being removed.

As illustrated in FIGS. 5 and 6, the test antenna 6 includes one mirror reflection type test antenna 6a as a first test antenna and one reflector reflection type test antenna 6b as a second test antenna. The reflector reflection type test antenna 6a transmits or receives a radio signal (also referred to as a measurement radio signal below) to or from the antenna 110 via the reflector 7. Such a radio signal is provided for measuring the transmission characteristics or the reception characteristics of the DUT 100. The mirror reflection type test antenna 6b transmits or receives radio signals for measuring the transmission characteristics or the reception characteristics of the DUT 100, to or from the antenna 110 in the DUT 100 via the mirror 9. Each of the test antennae 6 includes a horizontally polarized antenna and a vertically polarized antenna (see FIG. 2).

Reflector Reflection Type Test Antenna

Firstly, the reflector reflection type test antenna 6a will be described. The reflector reflection type test antenna 6a is used together with the reflector 7, and functions as a primary radiator. As the test antenna 6a, for example, an antenna for millimeter waves, that has directivity, such as a horn antenna can be used. The reflector 7 has a reflecting surface made of, for example, aluminum, which is curved in a curved surface, and reflects a radio wave of a radio signal for measurement. The reflector 7 has an offset parabolic structure in which a part of the rotating paraboloid of a perfect circular parabola is clipped. As illustrated in FIG. 1, the reflector 7 is attached to the required position of the anechoic box 50 on the side surface 52b by using a reflector holder 58.

The reflector 7 receives a radio wave of a test signal radiated from the test antenna 6a as the primary radiator disposed at a focal position defined from the rotating paraboloid, on the rotating paraboloid. Then, the reflector reflects the radio wave toward the DUT 100 held by the posture changeable mechanism 56 (during transmission). The reflector 7 receives the radio wave of a measurement target signal radiated from the antenna 110 by the DUT 100 that has received the test signal, on the rotating paraboloid. Then, the reflector reflects the measurement target signal toward the test antenna 6a (in reception). The reflector 7 is arranged at a position and a posture in which transmission and reception can be simultaneously performed. That is, the reflector 7 is configured to reflect the radio wave of the radio signal transmitted and received between the test antenna 6a and the antenna 110 of the DUT 100 on the rotating paraboloid.

With such a configuration, a radio wave (for example, test signal for the DUT 100) radiated from the test antenna 6a is reflected by the rotating paraboloid in a direction parallel to an axial direction of the rotating paraboloid, and a radio wave (for example, measurement target signal transmitted from the DUT 100) incident to the rotating paraboloid in the direction parallel to the axial direction of the rotating paraboloid is reflected by the rotating paraboloid, and thus the radio waves can be guided to the test antenna 6a. In other words, the reflector 7 converts a radio wave of a spherical wave radiated from the test antenna 6a to a radio wave of a plane wave and transmits the radio wave of the plane wave to the DUT 100, and also causes a radio wave of a plane wave that is radiated from the DUT 100 and then is incident on the reflector 7 to focus on the test antenna 6a. Compared to the parabolic type, the offset parabola requires the reflector 7 to be smaller and can be disposed so that the mirror surface becomes close to being a vertical surface. Thus, it is possible to reduce the size of the structure of the anechoic box 50.

As illustrated in FIG. 6, the reflector reflection type test antenna 6a is disposed below a horizontal plane HP passing through the arrangement position (origin O) of the DUT 100. A radio beam that is radiated from the test antenna 6a and then reflected by the reflector 7 is propagated in a negative direction of a Z axis and forms the quiet zone QZ having a required radius.

Mirror Reflection Type Test Antenna

Next, the mirror reflection type test antenna 6b will be described.

The mirror reflection type test antenna 6b transmits or receives a radio signal to and from the antenna 110 of the DUT 100 via the planar mirror 9 that reflects the radio wave of the measurement radio signal. The mirror 9 is made of, for example, aluminum and has a flat mirror surface. The radio beam radiated from the mirror reflection type test antenna 6b is mirror-reflected by the mirror 9.

Figure 7:
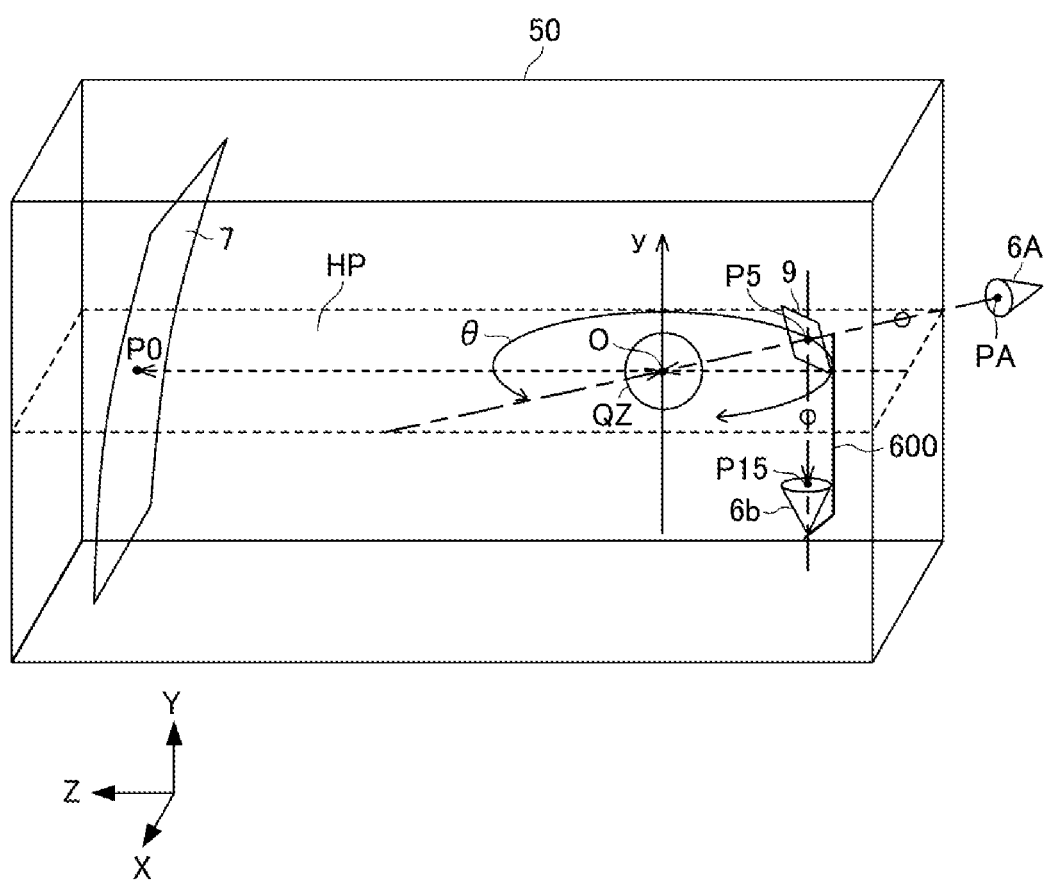
FIG. 7 is a schematic diagram illustrating an arrangement of a test antenna and a mirror in the anechoic box.

FIG. 7 is a schematic diagram illustrating arrangement of the mirror 9 and the mirror reflection type test antenna 6b in the anechoic box 50. The mirror 9 and the test antenna 6b can be rotationally moved in a direction θ around the y axis passing through the origin O by a movable antenna mechanism (not illustrated), in a state of being held by an antenna holding unit 600. The test antenna 6b is disposed below the horizontal plane HP. The mirror 9 is disposed so that a reflection point P5 of a radio beam on the mirror surface is positioned on the horizontal plane HP. A radio beam radiated from the test antenna 6b is reflected by the mirror 9 and transmitted to the origin O at which the DUT 100 is disposed. A radio beam radiated from the antenna 110 of the DUT 100 is reflected by the mirror 9 and transmitted to the test antenna 6b. If the mirror 9 is not provided, a test antenna 6A is disposed outside the anechoic box 50, and thus it is not possible to secure an inter-antenna distance (O-PA distance) required for the far field measurement. Since the propagation path of the radio beam is bent by the mirror 9, it is possible to dispose the test antenna 6b in the anechoic box 50, and secure the inter-antenna distance required for the far field measurement.

Specifically, in FIG. 7, a distance obtained by combining an O-P5 distance and a P5-P15 distance is equal to the O-PA distance being the inter-antenna distance required for the far field measurement. P5 indicates a reflection point at which a radio beam radiated from the test antenna 6b is reflected on the mirror 9. P15 indicates an aperture center of the test antenna 6b. PA indicates an aperture center of the virtual test antenna 6A. The propagation path between O and P5 is on the horizontal plane HP. The radio beam radiated from the reflector reflection type test antenna 6a is reflected at the reflection point P0 on the reflector 7 and transmitted to the origin O at which the DUT 100 is disposed. The propagation path between P0 and O is also on the horizontal plane HP.

The reflector reflection type test antenna 6a forms a so-called indirect far field (IFF). The mirror reflection type test antenna 6b forms a direct far field (DFF). The indirect far field refers to a far field formed by a reflective antenna using a reflector that converts a spherical wave to a plane wave. The direct far field is a far field directly formed by an antenna that does not use such a reflector. The mirror reflection type test antenna 6b reflects a radio beam using the mirror 9, but a distance traveled by the radio beam from the test antenna to the far field is equal to that when the mirror is not provided. Thus, the mirror reflection type test antenna 6b can be considered as a DEF type antenna.

For example, when the antenna size D of the antenna 110 is known, the distance from the mirror reflection type test antenna 6b to the antenna 110 of the DUT 100 via the corresponding mirror 9 may be set to be more than $2D^2/\lambda$. D indicates an antenna size of the antenna 110, and λ indicates a wavelength of a radio wave transmitted from the mirror reflection type test antenna 6. Therefore, it is possible to perform the far field measurement of the DUT 100.

The mirror reflection type test antenna 6b and the mirror 9 are arranged outside the path of a radio beam that is reflected by the reflector 7 of the reflector reflection type test antenna 6a and passes through the quiet zone QZ. With this configuration, in the test apparatus 1 according to the present embodiment, it is possible to form the favorable quiet zone QZ.

In the present embodiment, the quiet zone formed by the mirror reflection type test antenna 6b is the same as the quiet zone QZ formed by the reflector reflection type test antenna 6a, but is not limited to this. The quiet zone formed by the mirror reflection type test antenna 6b may be different from the quiet zone QZ formed by the reflector reflection type test antenna 6a. For example, if the quiet zone QZ formed by the reflector reflection type test antenna 6a is made wider, it is possible to use a wide quiet zone when the RF characteristics and the like are measured singly using the reflector reflection type test antenna 6a.

Angle of Arrival

As illustrated in FIGS. 5 and 6, a movable antenna mechanism 60 moves positions of the test antenna 6b and the mirror 9 on each circle so that radio signals can be transmitted or received at a plurality of different angles of arrival with respect to the DUT 100 with reference to a radio-wave arrival direction (negative direction of Z axis) from the test antenna 6a. The plurality of angles of arrival are, for example, 30°, 60°, 90°, 120°, and 150°. In this manner, it is possible to evenly perform the measurement within a predetermined angle range without omission, and thus it is possible to perform the far field measurement of the transmission and reception characteristics of the DUT 100, such as the RRM characteristics, with high accuracy. Therefore, it is possible to measure the RRM characteristics defined in, for example, the standard 3GPP TR 38.810 V16.2.0 (2019-03) with high accuracy.

Here, the "angle of arrival (AoA)" refers to an angle formed by a radio beam or the center of the radio beam arriving at the origin O at which the DUT 100 is disposed from the test antenna 6 with respect to a specific straight line (for example, Z axis) passing through the origin O. The angle of arrival can also be defined by two test antennae. In this case, an angle formed by a radio beam or the center of the radio beam arriving at the origin O from one test antenna with a radio-wave arrival direction (being a direction of the radio beam arriving at the origin O from another test antenna) as the reference is referred to as the "angle of arrival" or a "relative angle of arrival". When emitting from the origin O to the test antenna 6 or another test antenna, a radio wave emission direction is used instead of the radio-wave arrival direction, and an "angle of departure (AoD)" is used instead of the angle of arrival.

Movable Antenna Mechanism

Next, the movable antenna mechanism 60 will be described.

The movable antenna mechanism 60 moves the position of the test antenna 6b on a circle so that a radio signal can be directly transmitted or received at a plurality of angles of arrival to and from the DUT 100 installed in a far field based on an arrival direction of a radio wave from the test antenna 6a. For this purpose, the movable antenna mechanism includes the antenna holding unit 600 and a moving mechanism 700.

Antenna Holding Unit The antenna holding unit 600 holds the test antenna 6b and the planar mirror 9. The test antenna 6b and the mirror 9 are held by the antenna holding unit 600 at a required interval. The mirror 9 reflects a radio wave of a radio signal radiated from the test antenna 6b and transmits the radio wave to the antenna 110 of the DUT 100, and also reflects a radio wave of a radio signal radiated from the antenna 110 of the DUT 100 and transmits the radio wave to the test antenna 6b. The movable antenna mechanism 60 moves the position of the planar mirror 9 together with the test antenna 6b.

With this configuration, the path of the radio signal transmitted and received between the test antenna 6b and the antenna 110 of the DUT 100 can be changed by the mirror 9, so that even in the limited internal space 51 of the anechoic box 50, the inter-antenna distance required for the far field measurement can be secured.

Figure 8:
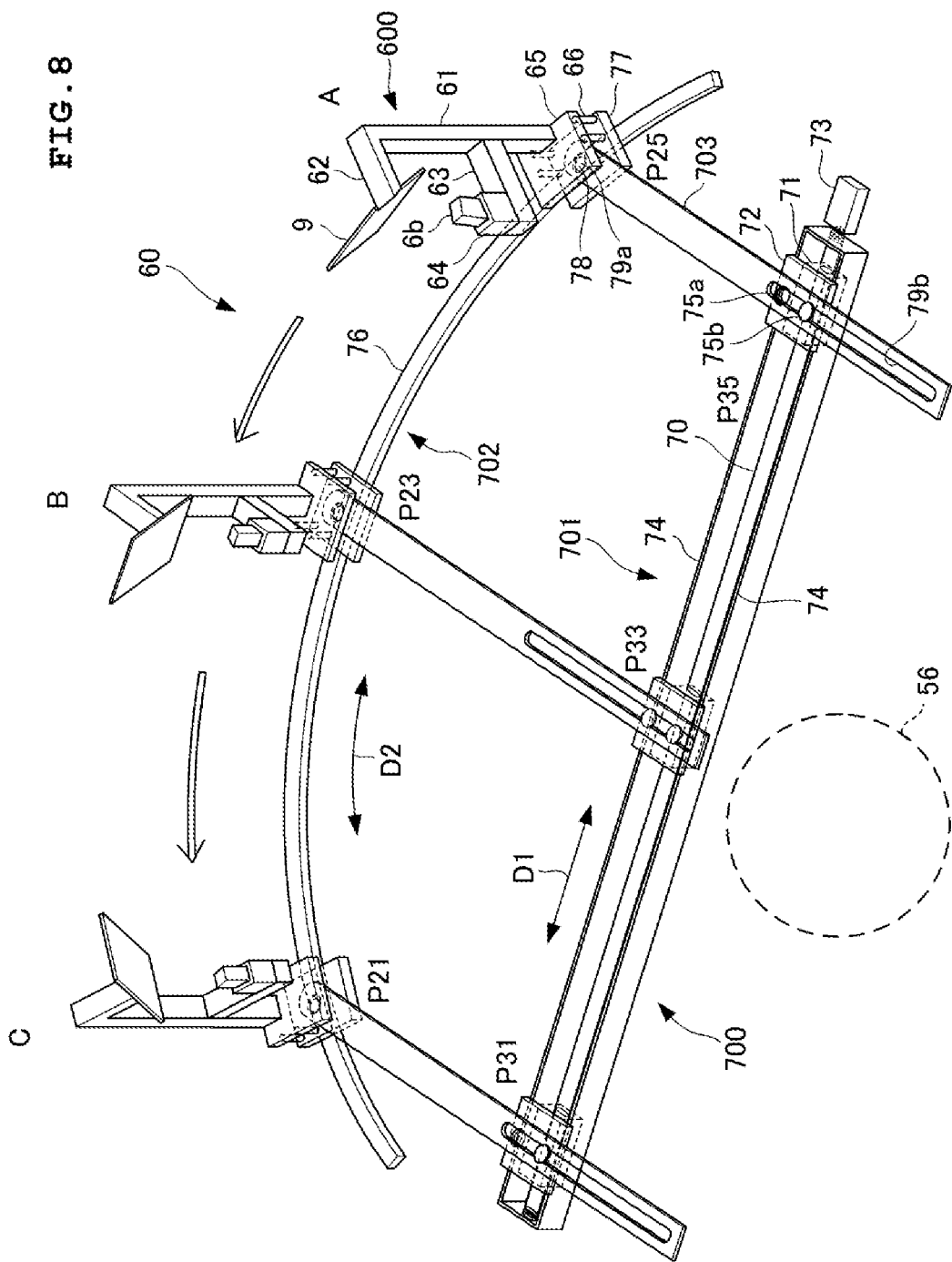
FIG. 8 is a diagram illustrating a structure and an operation of a movable antenna mechanism according to the first embodiment.

As illustrated in FIG. 8, the antenna holding unit 600 has an elongated rod-shaped or columnar fulcrum 61 that holds the test antenna 6b and the mirror 9 at intervals in a longitudinal direction. Specifically, a mirror attachment portion 62 extending in a direction orthogonal to the longitudinal direction of the fulcrum 61 is provided at one end of the fulcrum 61, and the mirror 9 is tilted at a predetermined angle and attached to an end portion of the mirror attachment portion 62. Further, an antenna attachment portion 63 extending in the direction orthogonal to the longitudinal direction is provided in the middle of the fulcrum 61 in the longitudinal direction, an angle adjusting table 64 is attached to an end portion of the antenna attachment portion 63, and the test antenna 6b is attached to the angle adjusting table 64 so as to have a predetermined angle. The other end of the fulcrum 61 is attached to a top surface of a support plate 65, and the support plate 65 is fixed to a movable stand 77 by a fixing tool 66 so as to be slightly lifted from a movable stand 77. The fulcrum 61 in FIG. 8 is configured so that the longitudinal direction of the fulcrum 61 is a vertical direction.

An angle of the test antenna 6b and an angle of the mirror 9 are set so that a radio beam of a radio signal radiated from the test antenna 6b is reflected by an entire surface of the mirror 9 and transmitted to the DUT 100.

The movable stand 77 is slidably attached to an arcuate rail 76, and can be movable in a direction D2 along a circular orbit formed with a vertical straight line passing through the origin O at which the DUT 100 is installed as a rotation axis (y axis). Regardless of any position of the movable stand 77 in the longitudinal direction of the rail 76, the movable stand 77 and the antenna holding unit 600 attached to the movable stand 77 are oriented in a direction in which the radio beam of the radio signal radiated from the test antenna 6b is reflected by the mirror 9 and transmitted toward the DUT 100.

In the present embodiment, the support plate 65 is used, but an end portion of the fulcrum 61 may be directly fixed to the movable stand 77.

Modification Example 1 of Antenna Holding Unit

Figure 9:
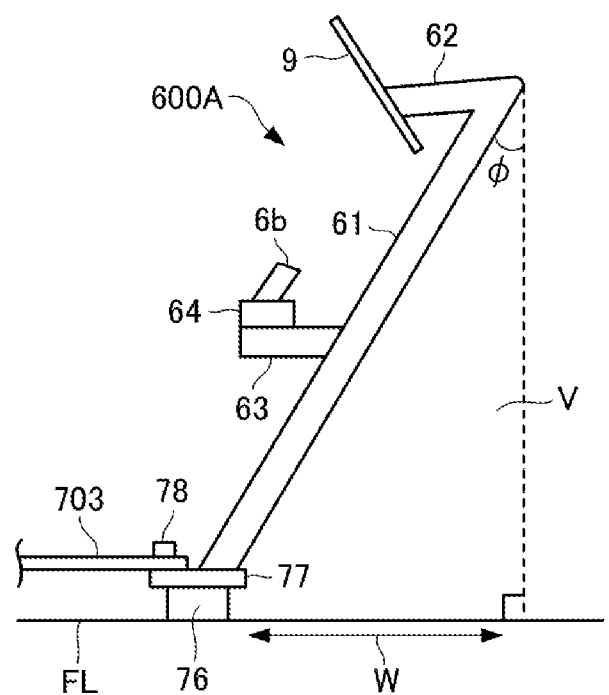
FIG. 9 is a diagram illustrating Modification Example 1 of an antenna holding unit.

FIG. 9 is a diagram illustrating a configuration of Modification Example 1 of the antenna holding unit. As illustrated in FIG. 9, the fulcrum 61 of an antenna holding unit 600A of Modification Example 1 is tilted from a vertical direction at an angle φ such that one end portion of the fulcrum 61 attached to the movable stand 77 of the moving mechanism 700 is closer to the center axis (y axis) of the circular orbit of the test antenna 6b or the mirror 9 than the other end portion (left side in FIG. 9 or the center side of the floor of the anechoic box 50) (see FIG. 10). In FIG. 9, the lower end of the fulcrum 61 is directly fixed to the movable stand 77. As compared with the antenna holding unit 600 in FIG. 8, the region indicated by a reference numeral W in FIG. 9 is opened, and a space V defined by the region W and the fulcrum 61 is opened.

In this manner, with the test apparatus 1 using the antenna holding unit 600A of Modification Example 1, it is possible to reduce the occupied (installation) area and the occupied space (volume) of the movable antenna mechanism 60, and it is possible to efficiently use the limited internal space 51 of the anechoic box 50.

Figure 10:
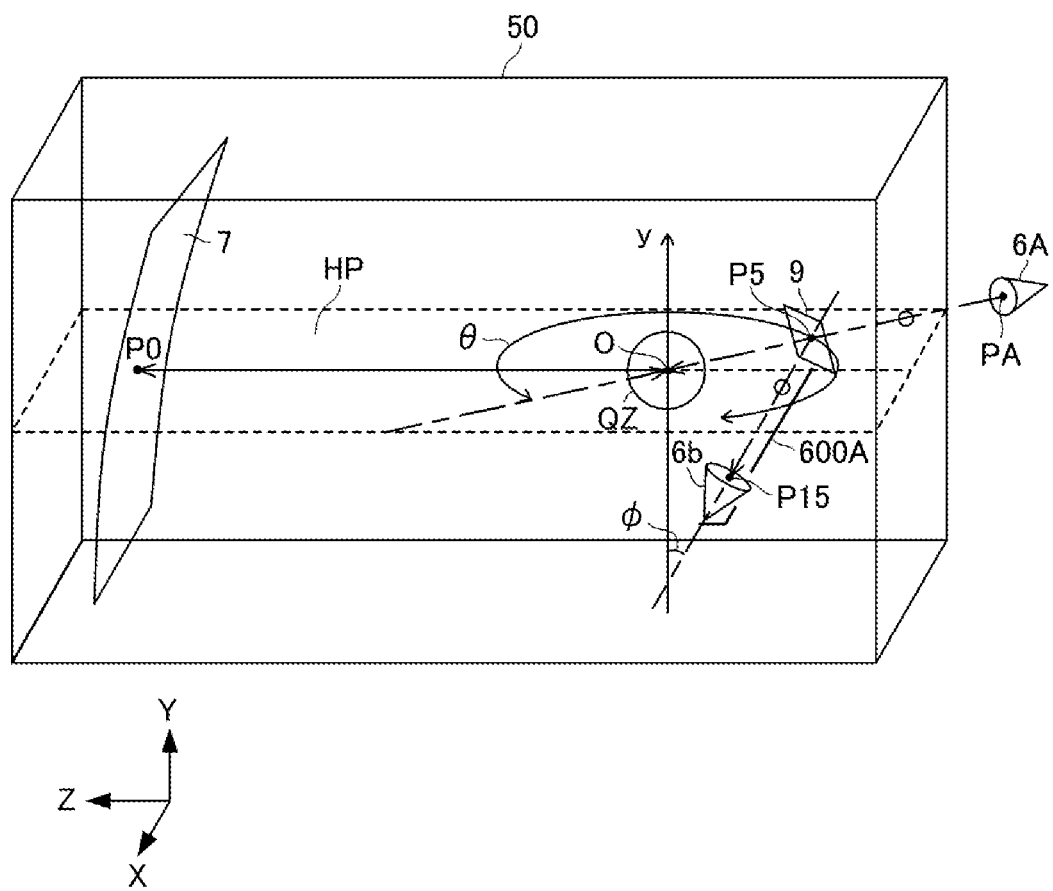
FIG. 10 is a schematic diagram illustrating an arrangement of a test antenna and a mirror held in the antenna holding unit of Modification Example 1.

FIG. 10 is a schematic diagram illustrating arrangement of the mirror 9 and the mirror reflection type test antenna 6b in the anechoic box 50 of the test apparatus 1 using the antenna holding unit 600A of Modification Example 1. The mirror 9 and the test antenna 6b can be rotated in a direction θ around the y axis passing through the origin O by a movable antenna mechanism (not illustrated), in a state of being held by the antenna holding unit 600A. A radio beam radiated from the test antenna 6b is reflected by the mirror 9 and transmitted to the origin O at which the DUT 100 is disposed. A radio beam radiated from the antenna 110 of the DUT 100 is reflected by the mirror 9 and transmitted to the test antenna 6b. If the mirror 9 is not provided, the test antenna 6A is disposed outside the anechoic box 50, and thus it is not possible to secure the inter-antenna distance (O-PA distance) required for the far field measurement. Since the propagation path of the radio beam is bent by the mirror 9, it is possible to dispose the test antenna 6b in the anechoic box 50, and secure the inter-antenna distance required for the far field measurement.

Specifically, in FIG. 10, a distance obtained by combining the O-P5 distance and the P5-P15 distance is equal to the O-PA distance being the inter-antenna distance required for the far field measurement.

Modification Example 2 of Antenna Holding Unit

Figure 11:
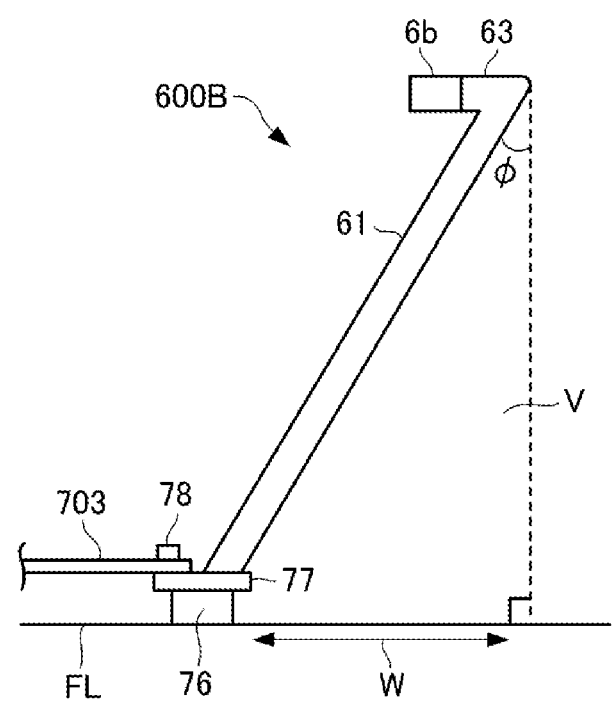
FIG. 11 is a diagram illustrating Modification Example 2 of the antenna holding unit.

FIG. 11 is a diagram illustrating a configuration of Modification Example 2 of the antenna holding unit. As illustrated in FIG. 11, in the same manner as Modification Example 1, the fulcrum 61 of an antenna holding unit 600B is tilted from a vertical direction at an angle φ such that one end portion of the fulcrum 61 attached to the movable stand 77 of the moving mechanism 700 is closer to the center axis (y axis) of the circular orbit of the test antenna 6b than the other end portion (left side in FIG. 11 or the center side of the floor of the anechoic box 50). In FIG. 11, the test antenna 6b is attached to an upper end of the fulcrum 61 via the antenna attachment portion 63. In the same manner as Modification Example 1, as compared with the antenna holding unit 600 in FIG. 8, the region indicated by the reference numeral W in FIG. 11 is opened, and the space V defined by the region W and the fulcrum 61 is opened.

With the test apparatus 1 using the antenna holding unit 600B of Modification Example 2, in the same manner as Modification Example 1, it is possible to reduce the occupied (installation) area and the occupied space (volume) of the movable antenna mechanism 60, and it is possible to efficiently use the limited internal space 51 of the anechoic box 50. Modification Example 2 is effective in a case where an inter-antenna distance required for far field measurement can be secured without using a mirror.

Moving Mechanism

Returning to FIG. 8, the moving mechanism 700 includes a linear motion unit 701, a circular motion unit 702, and a link 703 that converts a linear motion into a circular motion.

Linear Motion Unit

The linear motion unit 701 includes a ball screw 70, a nut portion 71 fitted to the ball screw 70 and linearly moved by a rotation of the ball screw 70, a moving stand or moving table 72 attached to an upper portion of the nut portion 71 and moved together with the nut portion 71, a motor 73 that rotates the ball screw 70, and a linear guide 74 that guides the linear movement of the moving table 72.

When the ball screw 70 is rotated by the motor 73, the nut portion 71 fitted to the ball screw 70 is moved in a linear direction Dl, so that the moving table 72 attached to the nut portion 71 is linearly moved.

Two pins 75a and 75b are erected on a top surface of the moving table 72 in a direction orthogonal to a longitudinal direction of the ball screw 70 at intervals.

Circular Motion Unit

The circular motion unit 702 includes the arcuate rail 76 and a movable stand 77 that straddles the rail 76 and is movable along the rail 76. One pin 78 is erected on a top surface of the movable stand 77.

Link

The link 703 converts a linear motion of the moving table 72 of the linear motion unit 701 into a part of a circular motion of the movable stand 77 of the circular motion unit 702, and connects the moving table 72 and the movable stand 77. Specifically, the link 703 has an elongated plate shape, with a pinhole 79a formed on one end side and a slot 79b formed on the other end side. The pin 78 erected on the movable stand 77 is passed through the pinhole 79a on the one end side of the link 703, and the link 703 can rotate around the pin 78. The two pins 75a and 75b are passed through the slot 79b on the other end side of the link 703, and the link 703 can move in an arrangement direction of the two pins 75a and 75b (direction orthogonal to the direction D1 of the linear motion). That is, a longitudinal direction of the link 703 is orthogonal to a moving direction of the moving table 72 of the linear motion unit 701.

By driving the motor 73, the ball screw 70 is rotated, so the moving table 72 attached to the nut portion 71 is linearly moved, and the movable stand 77 moves along the rail 76, along with the linear movement of the moving table 72. FIG. 8 illustrates a case where the movable stand 77 is at a position P25 (A in FIG. 8) and the moving table 72 is at a rightmost position P35 of the linear motion unit 701. With this arrangement, the test antenna 6b can emit a radio beam at an angle of arrival of 150°, for example, with reference to a direction of a radio beam arriving at the DUT 100 from the test antenna 6a.

When the moving table 72 of the linear motion unit 701 is moved to a center position P33, the movable stand 77 of the circular motion unit 702 follows a position P23 (B in FIG. 8). At this time, the test antenna 6b can emit a radio beam at an angle of arrival of, for example, 90°. In the same manner, when the moving table 72 is moved to a leftmost position P31, the movable stand 77 follows a position P21 (C in FIG. 8). At this time, the test antenna 6b can emit a radio beam at an angle of arrival of, for example, 30°.

By moving the position of the moving table 72, for example, the angles of arrival of 30°, 60°, 90°, 120°, and 150° can be formed.

With the configuration described above, the test apparatus 1 according to the present embodiment does not need to provide test antennae for the number of angles of arrival at which the test is performed, and the number of antennae can be reduced. In addition, the test antenna 6b can be moved so that any angle of arrival is formed within a predetermined range. Further, the movable antenna mechanism 60 can be installed in the periphery while avoiding the center posture changeable mechanism 56 in which the DUT 100 is held, and the occupied (installation) area and occupied space (volume) of the movable antenna mechanism 60 can be suppressed to be small. Therefore, the limited internal space 51 of the anechoic box 50 can be efficiently used.

In the present embodiment, the movable antenna mechanism 60 is disposed on the floor of the anechoic box 50, but the arrangement location is not limited to this, and may be disposed on the ceiling, not only horizontally, but also vertically or tilted.

Next, the integrated control device 10, the NR system simulator 20, and the signal processing unit 40 of the measurement device 2 constituting the test apparatus 1 according to the present embodiment will be described with reference to FIGS. 2 to 4.

Integrated Control Device

As described below, the integrated control device 10 collectively controls the NR system simulator 20, the posture changeable mechanism 56, and the movable antenna mechanism 60. For this purpose, the integrated control device 10 is communicably connected to the NR system simulator 20, the posture changeable mechanism 56, and the movable antenna mechanism 60 via a network 19 such as Ethernet (registered trademark), for example.

Figure 3:
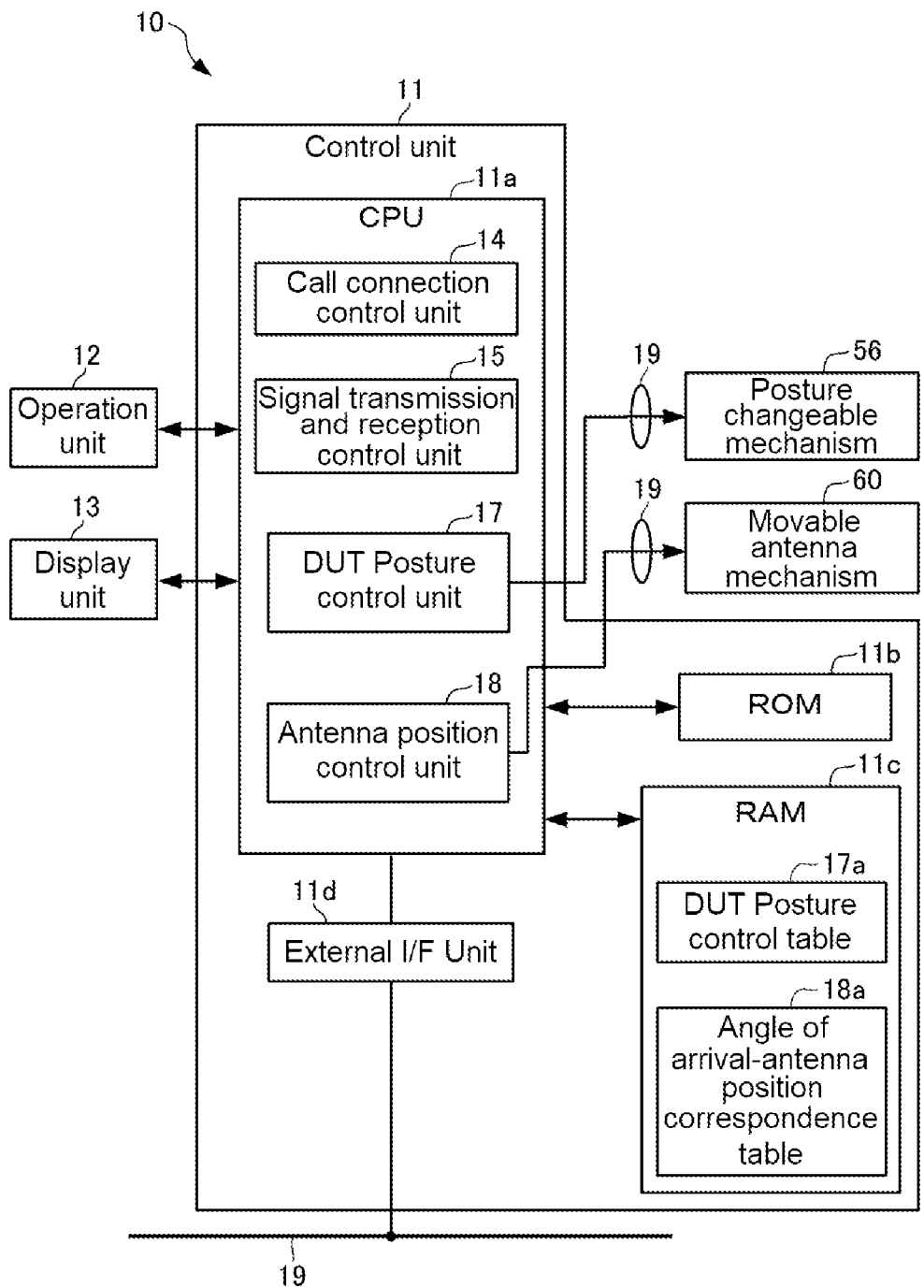
FIG. 3 is a block diagram illustrating a functional configuration of an integrated control device in the test apparatus according to the first embodiment of the present invention.

FIG. 3 is a block diagram illustrating a functional configuration of the integrated control device 10. As illustrated in FIG. 3, the integrated control device 10 includes a control unit 11, an operation unit 12, and a display unit 13. The control unit 11 is configured by, for example, a computer device. The computer device includes, for example, a central processing unit (CPU) 11a, a read only memory (ROM) 11b, a random access memory (RAM) 11c, an external interface (I/F) unit 11d, a non-volatile storage medium such as a solid state drive (SSD) or a hard disk device (not illustrated), and various input/output ports, as illustrated in FIG. 3.

The CPU 11a is configured to collectively control the NR system simulator 20 or the like as a target. The ROM 11b stores an operating system (OS) for starting up the CPU 11a, other programs, control parameters, and the like. The RAM 11c stores execution codes, data, and the like of the OS and applications used in an operation of the CPU 11a. The external interface (I/F) unit 11d has an input interface function of receiving an input of a predetermined signal and an output interface function of outputting a predetermined signal.

The external I/F unit 11d is communicably connected to the NR system simulator 20 via the network 19. The external I/F unit 11d is also connected to the posture changeable mechanism 56 or the movable antenna mechanism 60 in the anechoic box 50 via the network 19. The operation unit 12 and the display unit 13 are connected to the input/output port. The operation unit 12 is a functional unit for inputting various types of information such as commands. The display unit 13 is a functional unit of displaying various types of information such as an input screen for the various types of information and measurement results.

The above-described computer device functions as the control unit 11 when the CPU 11a executes a program stored in the ROM 11b with the RAM 11c as a work area. As illustrated in FIG. 3, the control unit 11 includes a call connection control unit 14, a signal transmission and reception control unit 15, a DUT posture control unit 17, and an antenna position control unit 18. The call connection control unit 14, the signal transmission and reception control unit 15, the DUT posture control unit 17, and the antenna position control unit 18 are also realized by the CPU 11a executing a predetermined program stored in the ROM 11b in the work area of the RAM 11c.

The call connection control unit 14 drives the test antenna 6 to transmit and receive a control signal (radio signal) to and from the DUT 100, and thus perform control of establishing a call (in a state where transmission and reception of a radio signal is possible) between the NR system simulator 20 and the DUT 100.

The signal transmission and reception control unit 15 monitors a user operation in the operation unit 12. When the user performs a predetermined measurement start operation related to the measurement of the transmission characteristics and the reception characteristics of the DUT 100, the signal transmission and reception control unit transmits a signal transmission command to the NR system simulator 20 through the call connection control in the call connection control unit 14. Further, the signal transmission and reception control unit 15 controls the NR system simulator 20 to transmit a test signal via the test antenna 6, and also controls the NR system simulator 20 to transmit a signal reception command and to receive a measurement target signal via the test antenna 6.

In the test of transmission and reception characteristics such as the RRM characteristics, which is performed using the two test antennae 6, the signal transmission and reception control unit 15 sets the angle of arrival. Specifically, the signal transmission and reception control unit selects one of a plurality of predetermined angles of arrival (for example, 30°, 60°, 90°, 120°, 150°) and sets the selected angle of arrival as a measurement condition (stored in the RAM 11*c* or the like). The angle of arrival may be selected by a user, or may be automatically selected by the control unit 11 or the like.

The antenna position control unit 18 controls a position of the test antenna 6*b*, based on the set angle of arrival. As illustrated in FIGS. 5 and 6, for example, in a case where the set angle of arrival is 30°, the test antenna 6*b* is moved to a position P11, and the mirror 9 is controlled to move to a position P1. Therefore, for example, an angle of arrival-antenna position correspondence table 18*a* indicating a correspondence relation between the angle of arrival and the position of the test antenna 6*b* is stored in advance in the ROM 11*b*. The angle of arrival-antenna position correspondence table 18*a* is expanded and used in a work area of the RAM 11*c* when the control is executed. The control unit 22 of the NR system simulator 20 may set the angle of arrival or control the position of the test antenna 6*b*.

The DUT posture control unit 17 controls the posture of the DUT 100 held by the posture changeable mechanism 56, during the measurement. In order to realize such control, for example, a DUT posture control table 17*a* is stored in advance in the ROM 11*b*. The DUT posture control table 17*a* stores the number of drive pulses (number of operation pulses) for determining the rotational drive of a stepping motor, as control data, when the stepping motor is adopted as the drive unit 56*a*, for example.

The DUT posture control unit 17 deploys the DUT posture control table 17*a* in the work area of the RAM 11*c*, and controls driving of the posture changeable mechanism 56 based on the DUT posture control table 17*a* so that the antenna 110 is sequentially directed in all three-dimensional directions, and the posture of the DUT 100 changes, as described above.

NR System Simulator

Figure 4:
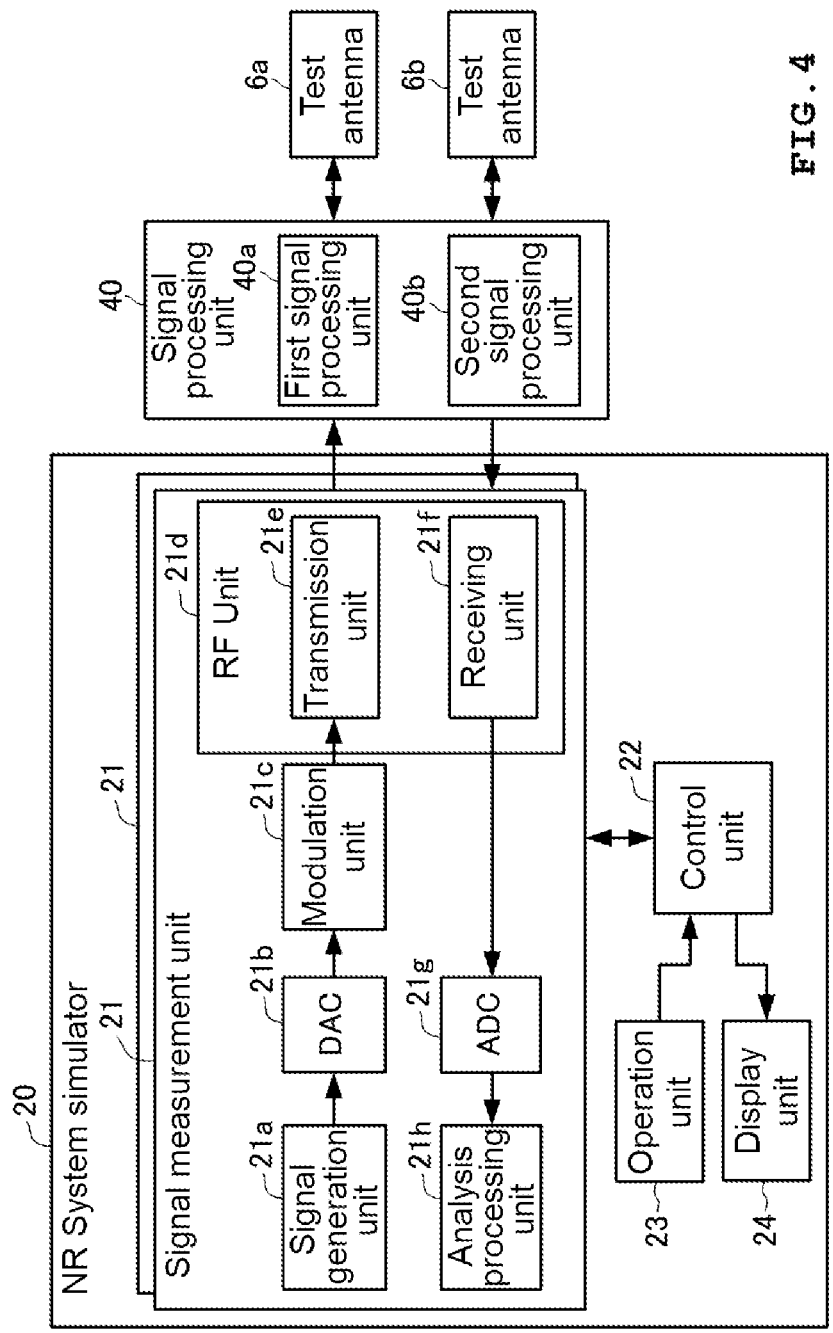
FIG. 4 is a block diagram illustrating a functional configuration of an NR system simulator in the test apparatus according to the first embodiment of the present invention.

As illustrated in FIG. 4, the NR system simulator 20 in the test apparatus 1 according to the present embodiment includes a signal measurement unit 21, a control unit 22, an operation unit 23, and a display unit 24. The signal measurement unit 21 includes a signal generation function unit and a signal analysis functional unit. The signal generation function unit includes a signal generation unit 21*a*, a digital-to-analog converter (DAC) 21*b*, a modulation unit 21*c*, a transmission unit 21*e* of an RF unit 21*d*. The signal analysis functional unit includes a receiving unit 21*f* of the RF unit 21*d*, an analog-to-digital converter (ADC) 21*g*, and an analysis processing unit 21*h*. Two sets of signal measurement units 21 may be provided to be able to correspond to the two test antennae 6*a* and 6*b* to be used.

In the signal generation function unit of the signal measurement unit 21, the signal generation unit 21*a* generates waveform data having a reference waveform, specifically, for example, an I component baseband signal and a Q component baseband signal being an orthogonal component signal of the I component baseband signal. The DAC 21*b* converts waveform data (I component baseband signal and Q component baseband signal) having a reference waveform output from the signal generation unit 21*a*, from a digital signal into an analog signal. The DAC outputs the resultant of the conversion to the modulation unit 21*c*. The modulation unit 21*c* performs modulation processing of mixing a local signal with each of the I component baseband signal and the Q component baseband signal, combining both signals, and outputting a digital modulation signal. The RF unit 21*d* generates a test signal corresponding to the frequency of each communication standard, from the digital modulation signal output from the modulation unit 21*c*. The RF unit outputs the generated test signal to the signal processing unit 40 by the transmission unit 21*e*.

The signal processing unit 40 includes a first signal processing unit 40*a* and a second signal processing unit 40*b*. The first signal processing unit performs signal processing such as frequency conversion on a signal transmitted and received to and from one test antenna 6*a* to be used. The second signal processing unit performs signal processing such as frequency conversion on a signal transmitted and received to and from the other test antenna 6*b* to be used. The first signal processing unit 40*a* performs signal processing on a test signal transmitted to the one test antenna 6*a* to be used and outputs the test signal to the test antenna 6*a*. The second signal processing unit 40*b* performs signal processing on a test signal transmitted to the other test antenna 6*b* to be used and outputs the test signal to the test antenna 6*b*.

In the signal analysis functional unit of the signal measurement unit 21, the receiving unit 21*f* receives the measurement target signal transmitted from the DUT 100 that has received the test signal with the antenna 110, through the signal processing unit 40. Then, the RF unit 21*d* converts the measurement target signal into a signal (IF signal) in an intermediate frequency band by mixing the measurement target signal with the local signal. The ADC 21*g* converts the measurement target signal converted into the IF signal by the receiving unit 21*f* of the RF unit 21*d*, from the analog signal into a digital signal. Then, the ADC outputs the digital signal into the analysis processing unit 21*h*.

The analysis processing unit 21*h* generates waveform data corresponding to each of the I component baseband signal and the Q component baseband signal by performing digital processing on the measurement target signal being the digital signal output by the ADC 21*g*. Then, the analysis processing unit performs processing of analyzing the I component baseband signal and the Q component baseband signal based on the waveform data. In the measurement of the transmission characteristics (RF characteristics) of the DUT 100, the analysis processing unit 21*h* can measure, for example, equivalent isotropically radiated power (EIRP), total radiated power (TRP), spurious radiation, modulation accuracy (EVM), transmission power, constellation, spectrum, and the like. In the measurement of the reception characteristics (RF characteristics) of the DUT 100, the analysis processing unit 21*h* can measure, for example, reception sensitivity, a bit error rate (BER), a packet error rate (PER), and the like. Here, EIRP indicates a radio signal intensity in the main beam direction of the antenna 110 of the DUT 100. Further, TRP indicates a total value of the electric power radiated into the space from the antenna 110 of the DUT 100.

The analysis processing unit 21*h* is capable of analyzing the RRM characteristics of the DUT 100, for example, whether or not a handover operation from one test antenna to the other test antenna is normally performed.

The control unit 22 is configured by, for example, a computer device including a CPU, a RAM, a ROM, and various input/output interfaces, similar to the control unit 11 of the integrated control device 10 described above. The CPU performs predetermined information processing and control for realizing each function of the signal generation function unit, the signal analysis functional unit, the operation unit 23, and the display unit 24.

The operation unit 23 and the display unit 24 are connected to the input/output interface of the computer device. The operation unit 23 is a functional unit for inputting various types of information such as commands. The display unit 24 is a functional unit of displaying various types of information such as an input screen for the various types of information and measurement results.

In the present embodiment, the integrated control device 10 and the NR system simulator 20 are separate devices, but may be configured as one device. In this case, the control unit 11 of the integrated control device 10 and the control unit 22 of the NR system simulator 20 may be integrated and realized by one computer device.

Signal Processing Unit

Next, the signal processing unit 40 will be described.

The signal processing unit 40 includes a first signal processing unit 40*a* and a second signal processing unit 40*b* that are provided between the NR system simulator 20 and the test antenna 6. The first signal processing unit performs signal processing such as frequency conversion on a signal transmitted and received to and from one test antenna 6*a* to be used. The second signal processing unit performs signal processing such as frequency conversion on a signal transmitted and received to and from the other test antenna 6*b* to be used.

The first signal processing unit 40*a* includes an up-converter, a down-converter, an amplifier, a frequency filter, and the like. The first signal processing unit performs signal processing such as frequency conversion (up-conversion), amplification, and frequency selection, on the test signal transmitted to the one test antenna 6*a* to be used, and outputs the test signal to the test antenna 6*a*. The first signal processing unit 40*a* performs signal processing such as frequency conversion (down-conversion), amplification, and frequency selection, on a measurement target signal input from the one test antenna 6*a* to be used. Then, the first signal processing unit outputs the measurement target signal to the signal measurement unit 21.

The second signal processing unit 40*b* includes an up-converter, a down-converter, an amplifier, a frequency filter, and the like. The second signal processing unit performs signal processing such as frequency conversion (up-conversion), amplification, and frequency selection, on the test signal transmitted to the other test antenna 6*b* to be used, and outputs the test signal to the test antenna 6*b*. The second signal processing unit 40*b* performs signal processing such as frequency conversion (down-conversion), amplification, and frequency selection, on a measurement target signal input from the other test antenna 6*b* to be used. Then, the second signal processing unit outputs the measurement target signal to the signal measurement unit 21.

Test Method

Figure 12:
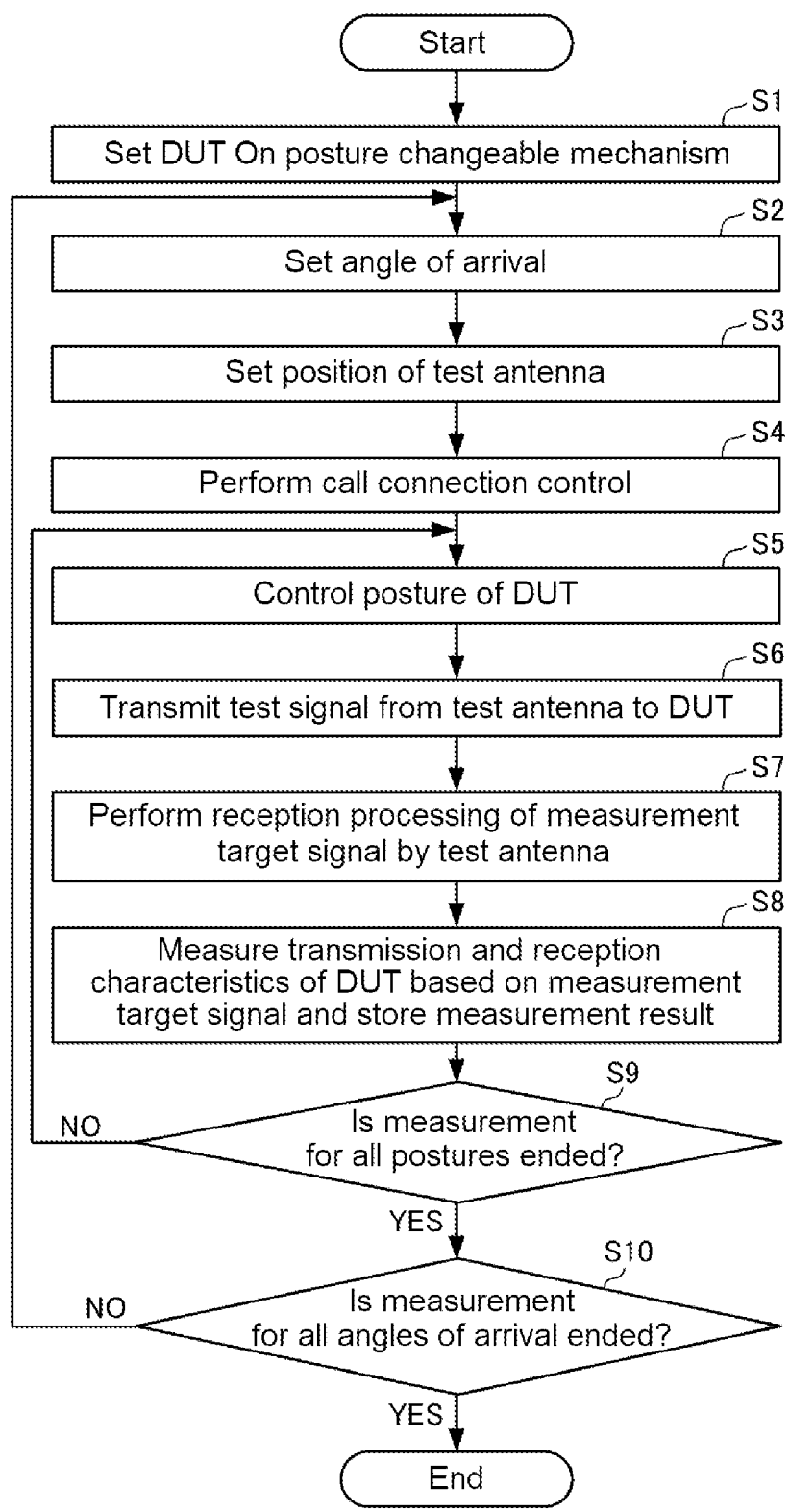
FIG. 12 is a flowchart illustrating an outline of a test method performed by using the test apparatus according to the first embodiment of the present invention.

Next, a test method performed by using the test apparatus 1 according to the present embodiment will be described with reference to the flowchart in FIG. 12. A test (for example, measurement of the transmission and reception characteristics such as the RRM characteristics) performed using two test antennae will be described below. However, this is just an example of the test method, and a specific test method varies depending on the type of test.

Firstly, the user sets the DUT 100 to be tested on the DUT mounting portion 56*d* of the posture changeable mechanism 56 provided in the internal space 51 of the anechoic box 50 (Step S1).

Then, the user uses the operation unit 12 of the integrated control device 10 to perform a measurement start operation for instructing the control unit 11 to start measurement of the transmission characteristics and the reception characteristics of the DUT 100. The measurement start operation may be performed by the operation unit 23 of the NR system simulator 20.

The control unit 11 sets one of predetermined angles of arrival (Step S2). For example, when the predetermined angles of arrival include 30°, 60°, 90°, 120°, and 150°, the control unit 11 selects one (for example, 30°) of the angles of arrival and sets (for example, stores in the RAM 11*c*) the selected angle of arrival as an angle of arrival to be measured. The angle of arrival may be set by the user.

Next, the control unit 11 moves a position of the test antenna 6*b* so as to have the angle of arrival set in Step S2. For example, in a case where the set angle of arrival is 30°, the test antenna 6*b* is moved to the position P11 and the mirror 9 is moved to the position P1. In a case where the angle of arrival is 60°, the test antenna 6*b* is moved to a position P12 and the mirror 9 is moved to a position P2. In a case where the angle of arrival is 90°, the test antenna 6*b* is moved to a position P13, the mirror 9 is moved to a position P3. In a case where the angle of arrival is 120°, the test antenna 6*b* is moved to a position P14 and the mirror 9 is moved to a position P4. In a case where the angle of arrival is 150°, the test antenna 6*b* is moved to the position P15 and the mirror 9 is moved to the position P5.

The call connection control unit 14 of the control unit 11 executes call connection control by using the test antenna 6 to transmit and receive a control signal (radio signal) to and from the DUT 100 (Step S4). Specifically, the NR system simulator 20 transmits a control signal (call connection request signal) having a predetermined frequency to the DUT 100 via the test antenna 6 by radio. The DUT 100 that has received the call connection request signal transmits, as a response, a control signal (call connection response signal) after setting the frequency for which the connection is requested. The NR system simulator 20 receives the call connection response signal and confirms that the response has been received normally. A series of the processing refers to the call connection control. With the call connection control, a state in which a radio signal having a predetermined frequency can be transmitted and received between the NR system simulator 20 and the DUT 100 via the test antenna 6 is established.

Processing in which the DUT 100 receives the radio signal transmitted from the NR system simulator 20 via the test antenna 6 is referred as downlink (DL) processing. On the contrary, processing in which the DUT 100 transmits the radio signal to the NR system simulator 20 via the test antenna 6 is referred to as uplink (UL) processing. The test antenna 6 is used to execute the processing of establishing a link (call) and the processing of downlink (DL) and uplink (UL) after the link is established, and also functions as the link antenna.

After establishing the call connection in Step S4, the DUT posture control unit 17 of the integrated control device 10 controls the posture of the DUT 100 disposed in the quiet zone QZ to a predetermined posture by the posture changeable mechanism 56 (Step S5).

After the posture of the DUT 100 is controlled to a predetermined posture by the posture changeable mechanism 56, the signal transmission and reception control unit 15 of the integrated control device 10 transmits a signal transmission command to the NR system simulator 20. The NR system simulator 20 transmits a test signal to the DUT 100 via the selected test antenna 6 based on the signal transmission command (Step S6).

The transmission control of the test signal by the NR system simulator 20 is executed as follows. In the NR system simulator 20 (see FIG. 4), the signal generation unit 21a generates a signal for generating a test signal under the control of the control unit 22 that has received the signal transmission command. Then, the DAC 21b performs digital-to-analog conversion processing on the signal generated by the signal generation unit. The modulation unit 21c performs modulation processing on the analog signal obtained by the digital-to-analog conversion. The RF unit 21d generates the test signal corresponding to the frequency of each communication standard, from the modulated signal. The transmission unit 21e transmits the test signal (DL data) to the signal processing unit 40.

The signal processing unit 40 is provided inside or output the anechoic box 50, and performs signal processing such as frequency conversion (up-conversion), amplification, and frequency selection on the test signal, and transmits the signal after the processing to the test antenna 6. Such a signal is output to the DUT 100 by the test antenna 6. In order to process the signals of the two test antennae, the signal processing unit 40 can process a plurality of signals in parallel.

The signal transmission and reception control unit 15 performs control during a period after the control of test signal transmission is started in Step S6 until the measurement of the transmission characteristics and the reception characteristics of the DUT 100 is ended, so that the test signal is transmitted at an appropriate timing.

The DUT 100 receives the test signal (DL data) transmitted via the test antenna 6 by the antenna 110 in a state of different postures that are sequentially changed based on the posture control in Step S5. In addition, the DUT transmits the measurement target signal being a response signal to the test signal.

After the transmission of the test signal is started in Step S6, reception processing is subsequently performed under the control of the signal transmission and reception control unit 15 (Step S7). In the reception processing, the test antenna 6 receives the measurement target signal transmitted from the DUT 100 that has received the test signal and outputs the received signal to the signal processing unit 40. The signal processing unit 40 performs signal processing such as frequency conversion (down-conversion), amplification, and frequency selection, and outputs the measurement target signal to the NR system simulator 20.

The NR system simulator 20 executes measurement processing of measuring the measurement target signal subjected to frequency conversion by the signal processing unit 40 (Step S8).

Specifically, the receiving unit 21f of the RF unit 21d in the NR system simulator 20 receives an input of the measurement target signal subjected to signal processing by the signal processing unit 40. Under the control of the control unit 22, the RF unit 21d converts the measurement target signal input to the receiving unit 21f into an IF signal having a lower frequency. Then, the ADC 21g converts the IF signal from an analog signal to a digital signal and outputs the digital signal to the analysis processing unit 21h, under the control of the control unit 22. The analysis processing unit 21h generates waveform data corresponding to each of the I component baseband signal and the Q component baseband signal. Further, the analysis processing unit 21h analyzes the measurement target signal based on the generated waveform data under the control of the control unit 22. In order to process the signals of the two test antennae, the signal processing unit 40 can process a plurality of signals in parallel.

More specifically, in the NR system simulator 20, the analysis processing unit 21h measures the transmission characteristics and the reception characteristics of the DUT 100 based on the analysis result of the measurement target signal under the control of the control unit 22.

For example, for the transmission characteristics (RF characteristics) of the DUT 100, processing as follows is performed. Firstly, the NR system simulator 20 transmits a request frame for transmitting an uplink signal as a test signal under the control of the control unit 22. The DUT 100 transmits the uplink signal frame as the measurement target signal to the NR system simulator 20 in response to the request frame for transmitting the uplink signal. The analysis processing unit 21h performs processing of evaluating the transmission characteristics of the DUT 100 based on the uplink signal frame.

For the reception characteristics (RF characteristics) of the DUT 100, processing as follows is performed, for example. Under the control of the control unit 22, the analysis processing unit 21h calculates the number of transmissions of the measurement frame transmitted from the NR system simulator 20 as the test signal, and a ratio of the number of receptions of ACK and NACK transmitted from the DUT 100 as the measurement target signal with respect to the measurement frame, as an error rate (PER).

Regarding the RRM characteristics of the DUT 100, for example, the analysis processing unit 21h may perform a test of whether or not the handover operation from one test antenna to the other test antenna is normally performed. The analysis processing unit may perform such a test under the control of the control unit 22 while changing the posture of the DUT 100.

In Step S8, the analysis processing unit 21h stores the measurement results of the transmission characteristics and the reception characteristics of the DUT 100 in a storage area such as the RAM (not illustrated), under the control of the control unit 22. The measurement results may be displayed on the display unit 24 or the display unit 13.

Then, the control unit 11 of the integrated control device 10 determines whether or not the measurement of the transmission characteristics and the reception characteristics of the DUT 100 has been ended for all desired postures (Step S9). Here, when it is determined that the measurement has not been ended (NO in Step S9), the process returns to Step S5 and continues the processing.

When the control unit 11 determines that the measurement is ended for all postures (YES in Step S9), the control unit 11 determines whether or not the measurement is ended for all angles of arrival (Step S10).

When the control unit 11 determines that the measurement is not ended for all the angles of arrival (NO in Step S10), the control unit 11 causes the process to return to Step S2 and continues the processing. When the control unit 11 determines that the measurement is ended for all the angles of arrival (YES in Step S10), the control unit 11 ends the test.

Action and Effect

As described above, the test apparatus 1 according to the present embodiment includes the movable antenna mechanism 60 that moves the position of the test antenna 6b on a circle so that a radio signal can be directly transmitted or received at a plurality of angles of arrival to and from the DUT 100 installed in a far field based on an arrival direction of a radio wave from the test antenna 6a. With this configuration, in far field measurement of transmission and reception characteristics such as RRM characteristics of the DUT 100, it is not necessary to provide a test antenna according to the number of angles of arrival to be tested, and it is possible to reduce the number of antennae. Therefore, it is possible to reduce a cost of devices such as antennae and a cost of attachment work.

In addition, with the test apparatus 1 according to the present embodiment, the path of the radio signal transmitted and received between the test antenna 6b and the antenna 110 of the DUT 100 can be changed by the mirror 9, so that even in the limited internal space 51 of the anechoic box 50, the inter-antenna distance required for the far field measurement can be secured.

Further, the test apparatus 1 according to the present embodiment has a configuration in which the movable antenna mechanism 60 converts the linear motion by the linear motion unit 701 into the circular motion of the circular motion unit 702 with the link 703, so that the movable antenna mechanism 60 can be installed in the periphery while avoiding the center posture changeable mechanism 56 in which the DUT 100 is held in the anechoic box 50, and the occupied (installation) area and occupied space (volume) of the movable antenna mechanism 60 can be kept small. Therefore, the limited internal space 51 of the anechoic box 50 can be efficiently used.

Second Embodiment

Next, a test apparatus according to a second embodiment of the present invention will be described.

The test apparatus 1 according to the second embodiment is different from the first embodiment in that the linear motion unit 701 and the link 703 are connected at a variable angle in a movable antenna mechanism 60B. In the first embodiment, the linear motion unit 701 and the link 703 are fixed and connected at 90°. Other components are the same, the same components are denoted by the same reference signs, and detailed description thereof will be omitted as appropriate.

Figure 13:
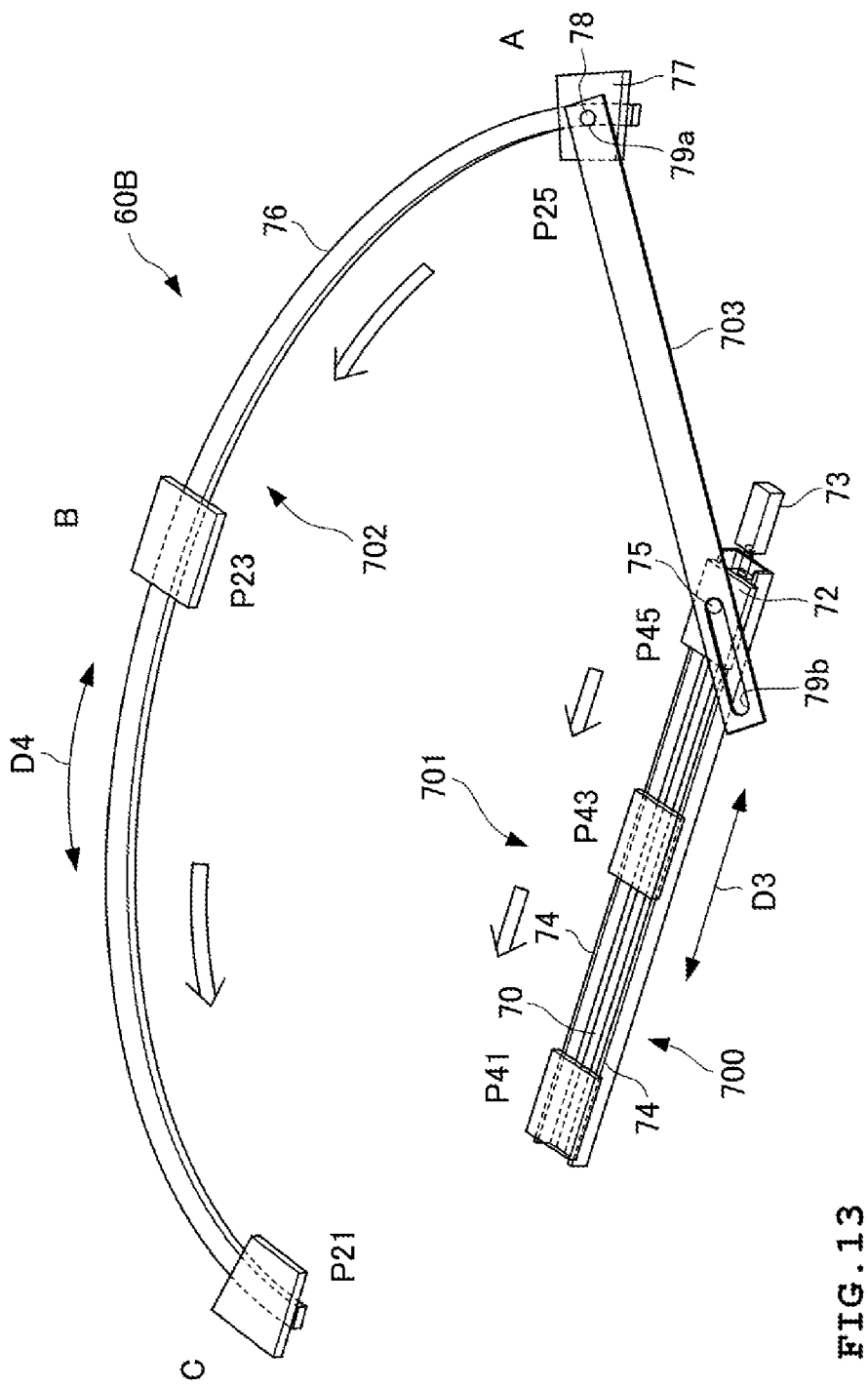
FIG. 13 is a diagram illustrating a structure and an operation of a movable antenna mechanism according to a second embodiment.

FIG. 13 is a diagram illustrating an outline of a structure and an operation of the movable antenna mechanism 60B according to the second embodiment. In FIG. 13, the antenna holding unit 600 is not illustrated. As illustrated in FIG. 13, the link 703 is connected to the moving table 72 such that an angle formed by a longitudinal direction of the link 703 with respect to a linear motion direction of the moving table 72 of the linear motion unit 701 is changed according to a position of the moving table 72. Specifically, one pin 75 is erected on the top surface of the moving table 72, and the pin 75 is passed through the slot 79b of the link 703. Therefore, the link 703 can be rotated around the pin 75 as a fulcrum, and can be moved in the longitudinal direction of the slot 79b by a length of the slot 79b.

The moving table 72 can be moved in a direction D3 of the linear motion along the ball screw 70 and the linear guide 74 of the linear motion unit 701 by driving the motor 73. The pin 78 is erected on the movable stand 77 to which the antenna holding unit 600 or 600A is attached, and the pin 78 is passed through the pinhole 79a of the link 703. Therefore, the moving table 72 of the linear motion unit 701 is moved in the direction D3 of the linear motion, so that the movable stand 77 connected by the link 703 can be moved in a direction D4 of the circular motion along the arcuate rail 76. That is, the linear motion of the moving table 72 driven by the linear motion unit 701 is converted into the circular motion of the movable stand 77 by the link 703.

FIG. 13 illustrates a case where the movable stand 77 is at the position P25 (A in FIG. 13) and the moving table 72 is at a position P45. With this arrangement, when the antenna holding unit 600 is attached to the movable stand 77 and the test antenna 6b and the mirror 9 are attached to the antenna holding unit 600, the test antenna 6b can emit a radio beam at an angle of arrival of 150°, for example, with reference to a direction of a radio beam arriving at the DUT 100 from the test antenna 6a.

When the moving table 72 is moved to a center position P43, the movable stand 77 follows the position P23 (B in FIG. 13). At this time, the test antenna 6b can emit a radio beam at an angle of arrival of, for example, 90°. In the same manner, when the moving table 72 is moved to a leftmost position P41, the movable stand 77 follows the position P21 (C in FIG. 13). At this time, the test antenna 6b can emit a radio beam at an angle of arrival of, for example, 30°.

With the configuration described above, the test apparatus 1 according to the present embodiment can shorten a length of the linear motion unit 701 in the longitudinal direction, as compared with the first embodiment. Therefore, the limited internal space 51 of the anechoic box 50 can be efficiently used by avoiding the center posture changeable mechanism 56 in which the DUT 100 is held in the anechoic box 50.

In the present embodiment, the movable antenna mechanism 60B is disposed on the floor of the anechoic box 50, but the arrangement location is not limited to this, and may be disposed on the ceiling, not only horizontally, but also vertically or tilted.

Third Embodiment

Next, a test apparatus according to a third embodiment of the present invention will be described.

The test apparatus 1 according to the third embodiment is different from the first and second embodiments in which the linear motion is converted into the circular motion, in that the circular motion is realized by using a rack and pinion in a movable antenna mechanism 60C. Other components are the same, the same components are denoted by the same reference signs, and detailed description thereof will be omitted as appropriate.

Figure 14:
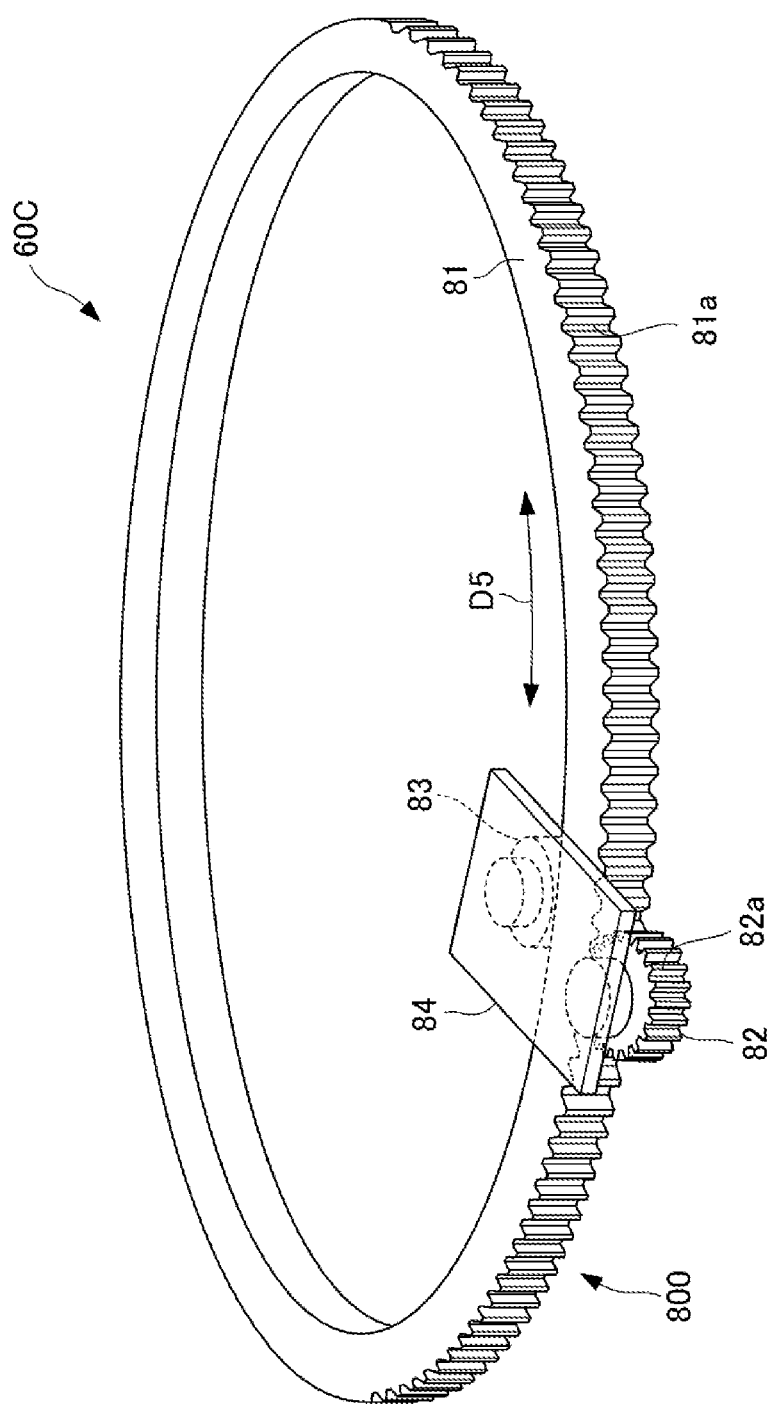
FIG. 14 is a diagram illustrating a schematic structure of a movable antenna mechanism according to a third embodiment.

FIG. 14 is a diagram illustrating an outline of a structure of a moving mechanism 800 included in the movable antenna mechanism 60C according to the third embodiment. In FIG. 14, the antenna holding unit 600 is not illustrated. As illustrated in FIG. 14, the movable antenna mechanism 60C includes a ring-shaped rack 81 having a plurality of teeth 81a formed on an outer peripheral surface, a pinion 82 having a gear 82a that engages with the teeth 81a of the rack 81 and moving along the rack 81 in a circular motion direction D5 by being rotated by a rotation drive unit (not illustrated) such as a motor, and a movable stand 84 attached to the pinion 82. Further, a guide following wheel 83 is disposed so as to face the pinion 82 with the rack 81 interposed therebetween.

At a center of the ring-shaped rack 81, the posture changeable mechanism 56 for holding the DUT 100 is disposed. The antenna holding unit 600 is attached to the movable stand 84, and the test antenna 6b and the mirror 9 are attached to the antenna holding unit 600. By moving the pinion 82 in a circular motion along the rack 81 by the rotation drive unit such as the motor and moving the pinion 82 to any position, the test antenna 6b can emit a radio beam at any angle of arrival with reference to a direction of a radio beam arriving at the DUT 100 from the test antenna 6a.

By moving the position of the movable stand 84, for example, the angles of arrival of 30°, 60°, 90°, 120°, and 150° can be formed.

In the present embodiment, the movable antenna mechanism 60C is disposed on the floor of the anechoic box 50, but the arrangement location is not limited to this, and may be disposed on the ceiling, not only horizontally, but also vertically or tilted. Although the teeth 81a are formed on the outer peripheral surface of the rack 81 and the pinion 82 is disposed on the outside of the rack 81, the teeth may be formed on an inner peripheral surface of the rack 81 and the pinion 82 may be disposed on the inside of the rack 81. Further, in the present embodiment, the rack 81 has a ring shape, but may have an arcuate shape to cover a range in which the required angle of arrival can be formed.

With this configuration described above, according to the test apparatus 1 according to the present embodiment, in far field measurement of transmission and reception characteristics such as RRM characteristics of the DUT 100, it is not necessary to provide a test antenna according to the number of angles of arrival to be tested, and it is possible to reduce the number of antennae. Therefore, it is possible to reduce a cost of devices such as antennae and a cost of attachment work. Further, with the test apparatus 1 according to the present embodiment, the movable antenna mechanism 60C can be installed in the periphery while avoiding the center posture changeable mechanism 56 in which the DUT 100 is held in the anechoic box 50, and the limited internal space 51 of the anechoic box 50 can be efficiently used.

Fourth Embodiment

Next, a test apparatus according to a fourth embodiment of the present invention will be described.

The test apparatus according to the fourth embodiment is different from the third embodiment in which the pinion is moved (circular motion) in that the rack is moved (rotated) in a movable antenna mechanism 60D. Other components are the same, the same components are denoted by the same reference signs, and detailed description thereof will be omitted as appropriate.

Figure 15:
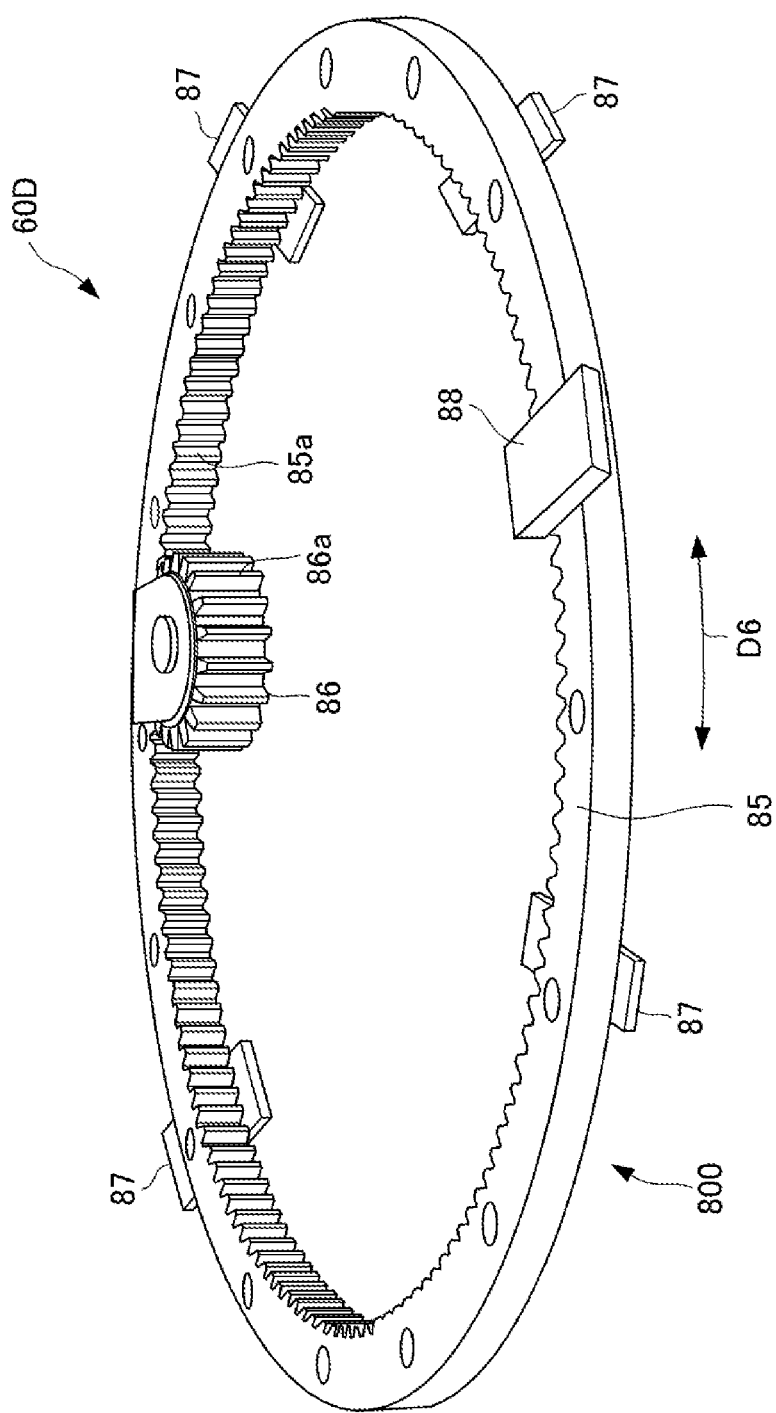
FIG. 15 is a diagram illustrating a schematic structure of a movable antenna mechanism according to a fourth embodiment.
Figure 16:
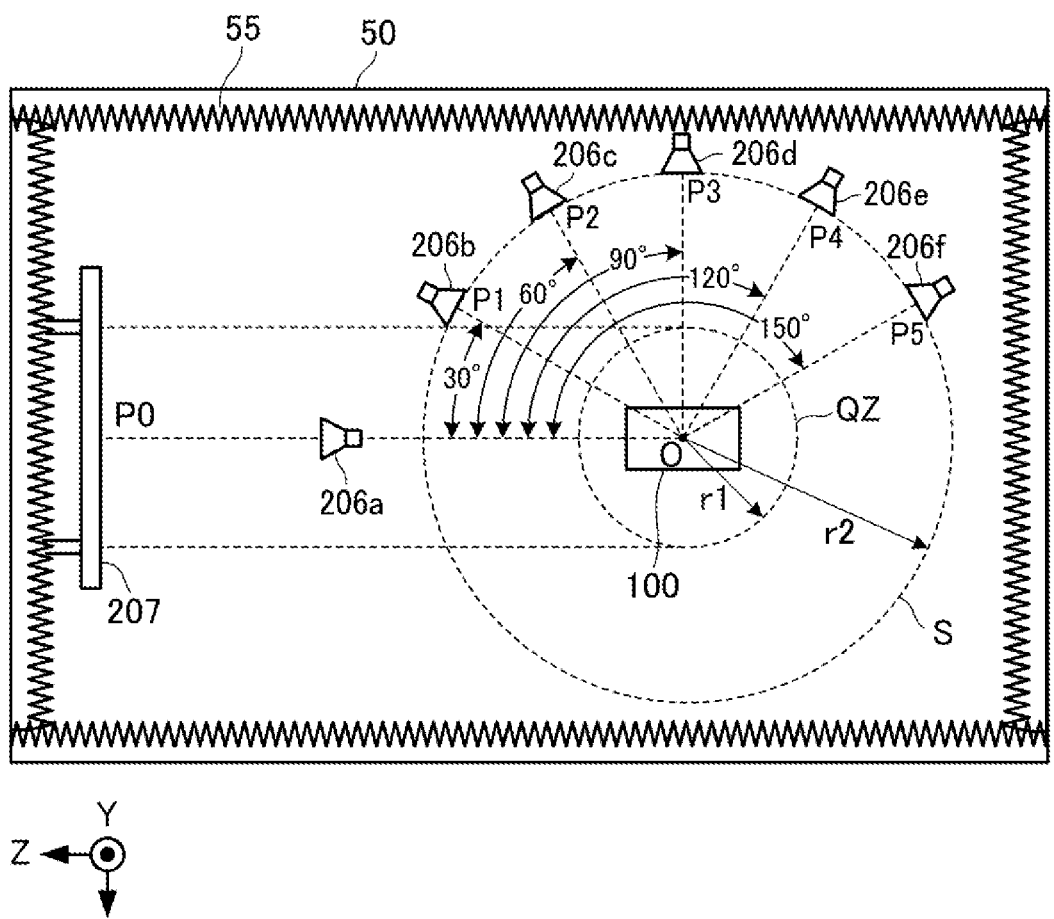
FIG. 16 is a plan view of a test apparatus in the related art when seen from above with a top plate of an anechoic box of the test apparatus being removed.

FIG. 15 is a diagram illustrating an outline of a structure of the moving mechanism 800 included in the movable antenna mechanism 60D according to the fourth embodiment. As illustrated in FIG. 15, the movable antenna mechanism 60D includes a ring-shaped rack 85 having a plurality of teeth 85a formed on an inner peripheral surface, a pinion 86 having a gear 86a that engages with the teeth 85a of the rack 85 and rotationally moving the rack 85 by being rotated by a rotation drive unit (not illustrated) such as a motor or the like, and a movable stand 88 attached to the rack 85. Further, under the rack 85, a guide portion 87 that slidably supports the rack 85 and guides the rotational movement is provided.

At a center of the ring-shaped rack 85, the posture changeable mechanism 56 for holding the DUT 100 is disposed. The antenna holding unit 600 is attached to the movable stand 88, and the test antenna 6b and the mirror 9 are attached to the antenna holding unit 600. By rotationally driving the pinion 86 by the rotation drive unit such as the motor, the rack 85 is driven to move the movable stand 88 in a circular motion to move the movable stand 88 to any position, the test antenna 6b can emit a radio beam at any angle of arrival with reference to a direction of a radio beam arriving at the DUT 100 from the test antenna 6a.

By moving the position of the movable stand 88, for example, the angles of arrival of 30°, 60°, 90°, 120°, and 150° can be formed.

In the present embodiment, the movable antenna mechanism 60D is disposed on the floor of the anechoic box 50, but the arrangement location is not limited to this, and may be disposed on the ceiling, not only horizontally, but also vertically or tilted. Although the teeth 85a are formed on the inner peripheral surface of the rack 85 and the pinion 86 is disposed inside the rack 85, the teeth may be formed on an outer peripheral surface of the rack 85 and the pinion 86 may be disposed on the outside of the rack 85. Further, in the present embodiment, the rack 85 has a ring shape, but may have an arcuate shape to cover a range in which the required angle of arrival can be formed.

With this configuration described above, according to the test apparatus 1 according to the present embodiment, in far field measurement of transmission and reception characteristics such as RRM characteristics of the DUT 100, it is not necessary to provide a test antenna according to the number of angles of arrival to be tested, and it is possible to reduce the number of antennae. Therefore, it is possible to reduce a cost of devices such as antennae and a cost of attachment work. Further, with the test apparatus 1 according to the present embodiment, the movable antenna mechanism 60D can be installed in the periphery while avoiding the center posture changeable mechanism 56 in which the DUT 100 is held in the anechoic box 50, and the limited internal space 51 of the anechoic box 50 can be efficiently used.

INDUSTRIAL APPLICABILITY

As described above, the present invention has an effect that it is possible to perform the far field measurement of the transmission and reception characteristics of a device under test, such as the RRM characteristics, with a small number of antennae, and is useful in general for the test apparatus and the test method of a radio terminal.

DESCRIPTION OF REFERENCE NUMERALS AND SIGNS

1 Test apparatus
2 Measurement device
5, 8 Link antenna
6, 6a, 6b Test antenna
7 Reflector
9 Mirror
10 Integrated control device
11, 22 Control unit
11a CPU
11b ROM 11c RAM
11d External interface unit
12, 23 Operation unit
13, 24 Display unit
14 Call connection control unit
15 Signal transmission and reception control unit
17 DUT posture control unit
17a DUT posture control table
18 Antenna position control unit
18a Angle of arrival-Antenna position correspondence table
19 Network
20 NR System Simulator
21 Signal measurement unit
21a Signal generation unit
21b DAC
21c Modulation unit
21d RF unit
21e Transmission unit
21f Receiving unit
21g ADC
21h Analysis processing unit
40 Signal processing Unit
40a First signal processing unit
40b Second signal processing unit
50 Anechoic box
51 Internal space
52 Housing body
52a Bottom surface
52b Side surface
52c Top surface
55 Radio wave absorber
56 Posture changeable mechanism
56a Drive unit
56b Turntable
56c Fulcrum
56d DUT mounting portion
57, 59 Holder
58 Reflector holder
60 movable antenna mechanism
600 Antenna holding unit
61 Fulcrum
62 Mirror attachment portion
63 Antenna attachment portion
64 Angle adjustment stand
65 Support plate
66 Fixing tool
700, 800 Moving mechanism
701 Linear motion unit
70 Ball screw
71 Nut portion
72 Moving table (moving stand)
73 Motor
74 Linear guide
75a, 75b Pin
702 Circular motion unit
76 Rail
77 Movable stand
78 Pin
703 Link
79a Pinhole
79b Slot
81, 85 Rack
82, 86 Pinion
83 Following wheel
84, 88 Movable stand
87 Guide portion
90 Rack structure body
90a Rack storage unit
100 DUT (device under test)
110 Antenna (antenna under test)
QZ Quiet zone
HP Horizontal plane

What is claimed is:

1. A test apparatus that measures transmission characteristics or reception characteristics of a device under test including an antenna under test, the apparatus comprising:
an anechoic box that has an internal space that is not influenced by a surrounding radio wave environment;
a posture changeable mechanism that sequentially changes a posture of the device under test disposed in a quiet zone in the internal space;
a first test antenna and a second test antenna that are accommodated in the internal space and transmit or receive radio signals to or from the antenna under test, for measuring the transmission characteristics or the reception characteristics of the device under test;
a reflector that reflects a radio signal radiated by the first test antenna and converts the radio signal into a plane wave radio signal; and
a movable antenna mechanism that moves a position of the second test antenna such that the radio signal is transmitted to or received from the device under test installed in a far field at a plurality of angles of arrival or a plurality of angles of departure, with reference to a radio-wave arrival direction from the first test antenna or a radio wave emission direction to the first test antenna.

2. The test apparatus according to claim 1,
wherein the movable antenna mechanism includes
an antenna holding unit that holds the second test antenna, and
a moving mechanism that moves the antenna holding unit on a circle.

3. The test apparatus according to claim 2,
wherein the antenna holding unit has a columnar fulcrum that holds the second test antenna, and
the fulcrum is tilted from a vertical direction such that one end portion of the fulcrum attached to the moving mechanism is closer to a center axis of the circle than the other end portion of the fulcrum.

4. The test apparatus according to claim 2, further comprising:
a mirror that reflects a radio signal radiated from the second test antenna and transmits the radio signal to the antenna under test, and reflects a radio signal radiated from the antenna under test and transmits the radio signal to the second test antenna,
wherein the antenna holding unit holds the second test antenna and the mirror at an interval in a longitudinal direction.

5. The test apparatus according to claim 2,
wherein the moving mechanism includes
a linear motion unit that linearly moves a moving stand,
an arcuate rail,
a movable stand to which the antenna holding unit is fixed and which is movable along the rail, and
a link that connects the moving stand and the movable stand and moves the movable stand along the rail by linear movement of the moving stand, and
the link is connected to the moving stand such that a longitudinal direction of the link is consistently orthogonal to a moving direction of the moving stand.

6. The test apparatus according to claim 3,
wherein the moving mechanism includes
   a linear motion unit that linearly moves a moving stand,
   an arcuate rail,
   a movable stand to which the antenna holding unit is fixed and which is movable along the rail, and
   a link that connects the moving stand and the movable stand and moves the movable stand along the rail by linear movement of the moving stand, and
the link is connected to the moving stand such that an angle formed by a longitudinal direction of the link with respect to a moving direction of the moving stand is changed according to a position of the moving stand.

7. The test apparatus according to claim 2,
wherein the moving mechanism includes
   a ring-shaped or arcuate rack having a plurality of teeth formed on an inner peripheral surface or an outer peripheral surface,
   a pinion having a gear that engages with the teeth of the rack, and moving along the rack by being rotated by a rotation drive unit, and
   a movable stand attached to the pinion, and
the antenna holding unit is attached to the movable stand.

8. The test apparatus according to claim 3,
wherein the moving mechanism includes
   a ring-shaped or arcuate rack having a plurality of teeth formed on an inner peripheral surface or an outer peripheral surface,
   a pinion having a gear that engages with the teeth of the rack, and rotationally moving the rack by being rotated by a rotation drive unit, and
   a movable stand attached to the rack, and
the antenna holding unit is attached to the movable stand.

9. The test apparatus according to claim 3, further comprising:
   a mirror that reflects a radio signal radiated from the second test antenna and transmits the radio signal to the antenna under test, and reflects a radio signal radiated from the antenna under test and transmits the radio signal to the second test antenna,
wherein the antenna holding unit holds the second test antenna and the mirror at an interval in a longitudinal direction.

10. The test apparatus according to claim 4,
wherein the moving mechanism includes
   a linear motion unit that linearly moves a moving stand,
   an arcuate rail,
   a movable stand to which the antenna holding unit is fixed and which is movable along the rail, and
   a link that connects the moving stand and the movable stand and moves the movable stand along the rail by linear movement of the moving stand, and
the link is connected to the moving stand such that a longitudinal direction of the link is consistently orthogonal to a moving direction of the moving stand.

11. The test apparatus according to claim 4,
wherein the moving mechanism includes
   a ring-shaped or arcuate rack having a plurality of teeth formed on an inner peripheral surface or an outer peripheral surface,
   a pinion having a gear that engages with the teeth of the rack, and rotationally moving the rack by being rotated by a rotation drive unit, and
   a movable stand attached to the rack, and
the antenna holding unit is attached to the movable stand.

12. A test method using a test apparatus that measures transmission characteristics or reception characteristics of a device under test including an antenna under test, the test apparatus including
   an anechoic box that has an internal space that is not influenced by a surrounding radio wave environment,
   a posture changeable mechanism that sequentially changes a posture of the device under test disposed in a quiet zone in the internal space,
   a first test antenna and a second test antenna that are accommodated in the internal space and transmit or receive radio signals to or from the antenna under test, for measuring the transmission characteristics or the reception characteristics of the device under test,
   a reflector that reflects a radio signal radiated by the first test antenna and converts the radio signal into a plane wave radio signal, and
   a movable antenna mechanism that moves a position of the second test antenna such that the radio signal is transmitted to or received from the device under test installed in a far field at a plurality of angles of arrival or a plurality of angles of departure, with reference to a radio-wave arrival direction from the first test antenna or a radio wave emission direction to the first test antenna,
the method comprising:
   a step of selecting one angle of arrival among a plurality of angles of arrival or one angle of departure among a plurality of angles of departure;
   a step of moving the second test antenna by the movable antenna mechanism to have the selected angle of arrival or angle of departure;
   a step of sequentially changing the posture of the device under test disposed in the quiet zone; and
   a step of measuring the transmission characteristics or the reception characteristics of the device under test by using the first and second test antennae, each time the posture of the device under test is changed.

* * * * *